United States Patent
Tatani et al.

(10) Patent No.: US 10,658,405 B2
(45) Date of Patent: May 19, 2020

(54) SOLID-STATE IMAGE SENSOR, ELECTRONIC APPARATUS, AND IMAGING METHOD

(71) Applicant: SONY CORPORATION, Tokyo (JP)

(72) Inventors: Keiji Tatani, Kanagawa (JP); Tomoharu Ogita, Kanagawa (JP); Takashi Nagano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/213,038

(22) Filed: Dec. 7, 2018

(65) Prior Publication Data

US 2019/0109165 A1 Apr. 11, 2019

Related U.S. Application Data

(63) Continuation of application No. 15/128,629, filed as application No. PCT/JP2015/057836 on Mar. 17, 2015, now Pat. No. 10,181,485.

(30) Foreign Application Priority Data

Mar. 31, 2014 (JP) .................................. 2014-071167

(51) Int. Cl.
*H01L 27/146* (2006.01)
*H04N 5/232* (2006.01)
(Continued)

(52) U.S. Cl.
CPC .... *H01L 27/14605* (2013.01); *H01L 27/1464* (2013.01); *H01L 27/14621* (2013.01);
(Continued)

(58) Field of Classification Search
CPC ...... H04N 9/045; H04N 5/378; H04N 5/3745; H04N 5/3696; H04N 5/23251;
(Continued)

(56) References Cited

U.S. PATENT DOCUMENTS

| 10,181,485 B2 * | 1/2019 | Tatani ............... H01L 27/14621 |
| 2009/0122171 A1 * | 5/2009 | Suzuki ............... H04N 5/23212 348/294 |

(Continued)

FOREIGN PATENT DOCUMENTS

| CN | 102983143 | 3/2013 |
| CN | 103067674 | 4/2013 |

(Continued)

OTHER PUBLICATIONS

Official Action (with English translation) for Chinese Patent Application No. 201580015676.0, dated Oct. 29, 2018, 16 pages.

(Continued)

*Primary Examiner* — Timothy J Henn
(74) *Attorney, Agent, or Firm* — Sheridan Ross P.C.

(57) ABSTRACT

The present disclosure relates to a solid-state image sensor, an electronic apparatus and an imaging method by which specific processing other than normal processing can be sped up with reduced power consumption.

The solid-state image sensor includes a pixel outputting a pixel signal used to construct an image and a logic circuit driving the pixel, and is configured of a stacked structure in which a first semiconductor substrate including a plurality of the pixels and a second semiconductor substrate including the logic circuit are joined together. In addition, among the plurality of pixels, a specific pixel is connected to the logic circuit independently of a normal pixel, the specific pixel being the pixel that outputs the pixel signal used in the specific processing other than imaging processing in which the image is imaged. The present technology can be applied to a stacked solid-state image sensor, for example.

17 Claims, 16 Drawing Sheets

(51) Int. Cl.
*H04N 5/369* (2011.01)
*H04N 5/3745* (2011.01)
*H04N 9/04* (2006.01)
*H04N 5/374* (2011.01)
*H04N 5/378* (2011.01)

(52) U.S. Cl.
CPC .. *H01L 27/14623* (2013.01); *H01L 27/14627* (2013.01); *H01L 27/14634* (2013.01); *H01L 27/14636* (2013.01); *H01L 27/14641* (2013.01); *H01L 27/14645* (2013.01); *H01L 27/14665* (2013.01); *H04N 5/23212* (2013.01); *H04N 5/23251* (2013.01); *H04N 5/3696* (2013.01); *H04N 5/374* (2013.01); *H04N 5/378* (2013.01); *H04N 5/3745* (2013.01); *H04N 9/045* (2013.01)

(58) Field of Classification Search
CPC .............. H04N 5/23212; H04N 5/374; H01L 27/14605; H01L 27/14645; H01L 27/14665; H01L 27/14641; H01L 27/1464; H01L 27/14636; H01L 27/14634; H01L 27/14627; H01L 27/14623; H01L 27/14621
See application file for complete search history.

(56) References Cited

U.S. PATENT DOCUMENTS

| | | | | |
|---|---|---|---|---|
| 2009/0289169 A1* | 11/2009 | Yang | ............... | H04N 5/23212 250/201.2 |
| 2010/0188532 A1* | 7/2010 | Kusaka | ............... | H04N 5/23212 348/240.99 |
| 2011/0279727 A1 | 11/2011 | Kusaka et al. | | |
| 2012/0293698 A1* | 11/2012 | Sukegawa | ............... | H01L 25/167 348/294 |
| 2013/0057699 A1* | 3/2013 | Ooki | ............... | H01L 27/14621 348/164 |
| 2013/0314573 A1* | 11/2013 | Tsukimura | ............. | H04N 5/335 348/302 |
| 2014/0028877 A1* | 1/2014 | Jang | ............... | H04N 5/225 348/231.99 |
| 2014/0078343 A1* | 3/2014 | Dai | ............... | H04N 5/772 348/231.99 |
| 2015/0102442 A1* | 4/2015 | Ootsuka | ............... | H04N 5/23212 257/432 |
| 2015/0156428 A1* | 6/2015 | Uchida | ............... | H04N 5/3696 348/294 |
| 2016/0014359 A1* | 1/2016 | Ota | ............... | H04N 5/3696 348/223.1 |
| 2016/0322412 A1* | 11/2016 | Yamamoto | ........ | H01L 27/14621 |

FOREIGN PATENT DOCUMENTS

| | | |
|---|---|---|
| JP | 2008-067241 | 3/2008 |
| JP | 2012-060425 | 3/2012 |

OTHER PUBLICATIONS

Official Action (with English translation) for Chinese Patent Application No. 201580015676.0, dated Jun. 14, 2019, 15 pages.

* cited by examiner

FIG. 14

SOLID-STATE IMAGE SENSOR, ELECTRONIC APPARATUS, AND IMAGING METHOD

CROSS REFERENCE TO RELATED APPLICATIONS

This application is a continuation of U.S. patent application Ser. No. 15/128,629, filed Sep. 23, 2016, which is a national stage application under 35 U.S.C. 371 and claims the benefit of PCT Application No. PCT/JP2015/057836, having an international filing date of Mar. 17, 2015, which designated the United States, which PCT application claimed the benefit of Japanese Patent Application No. 2014-071167, filed Mar. 31, 2014, the disclosures of which are incorporated herein by reference in their entirety.

TECHNICAL FIELD

The present disclosure relates to a solid-state image sensor, an electronic apparatus and an imaging method, particularly to a solid-state image sensor, an electronic apparatus and an imaging method by which specific processing other than normal imaging can be sped up with reduced power consumption.

BACKGROUND ART

An electronic apparatus equipped with an imaging function such as a digital still camera or a digital video camera of the related art employs a solid-state image sensor such as a CCD (Charge Coupled Device) or CMOS (Complementary Metal Oxide Semiconductor) image sensor. The solid-state image sensor includes a pixel formed of a combination of a PD (photodiode) performing photoelectric conversion and a plurality of transistors, where an image is constructed on the basis of a pixel signal output from a plurality of pixels arranged in a plane.

Moreover, with the recent size reduction of the electronic apparatus equipped with the solid-state image sensor, the size reduction or area reduction of the solid-state image sensor has been underway.

Patent Document 1 for example discloses a stacked solid-state image sensor realizing area reduction with a configuration in which a substrate forming a pixel array unit that includes a plurality of pixels arranged in an array and a substrate performing signal processing against a pixel signal are stacked on top of each other.

CITATION LIST

Patent Document

Patent Document 1: Japanese Patent Application Laid-Open No. 2010-245506

SUMMARY OF THE INVENTION

Problems to be Solved by the Invention

Now, the CMOS image sensor generally adopts a mode of scanning each row or column in reading a signal from the pixel. Accordingly, when the CMOS image sensor of the related art performs processing that randomly accesses only a part of the pixels, the pixels need to be driven at least by the row or column in which the part of the pixels is arranged. Therefore, when only a part of the pixels is driven in specific processing other than normal imaging such as processing that performs motion detection, processing that functions as an illuminance sensor or processing that performs phase difference autofocus, the row or column in which the part of the pixels is arranged is to be driven. It is thus difficult to speed up driving in such specific processing, the execution of which sometimes results in increased power consumption.

The present disclosure has been made in view of such circumstances and aims to speed up specific processing other than normal imaging with reduced power consumption.

Solutions to Problems

A solid-state image sensor according to one aspect of the present disclosure includes a pixel outputting a pixel signal used to construct an image and a logic circuit driving the pixel, and is configured of a stacked structure in which a first semiconductor substrate including a plurality of the pixels and a second semiconductor substrate including the logic circuit are joined together, where a specific pixel among the plurality of the pixels is connected to the logic circuit independently of a normal pixel being the pixel other than the specific pixel, the specific pixel being the pixel that outputs the pixel signal used in specific processing other than imaging processing in which the image is imaged.

An electronic apparatus according to another aspect of the present disclosure is equipped with a solid-state image sensor that includes a pixel outputting a pixel signal used to construct an image and a logic circuit driving the pixel, where the solid-state image sensor is configured of a stacked structure in which a first semiconductor substrate including a plurality of the pixels and a second semiconductor substrate including the logic circuit are joined together, and a specific pixel among the plurality of the pixels is connected to the logic circuit independently of a normal pixel being the pixel other than the specific pixel, the specific pixel being the pixel that outputs the pixel signal used in specific processing other than imaging processing in which the image is imaged.

According to another aspect of the present disclosure, there is provided an imaging method employed by a solid-state image sensor that includes a plurality of pixels outputting a pixel signal used to construct an image and a logic circuit driving the pixel, and is configured of a stacked structure in which a first semiconductor substrate including the plurality of pixels and a second semiconductor substrate including the logic circuit are joined together, while at the same time a specific pixel among the plurality of pixels is connected to the logic circuit independently of a normal pixel being the pixel other than the specific pixel being the pixel that outputs the pixel signal used in specific processing other than imaging processing in which the image is imaged, the method including a step of performing the specific processing on the basis of the pixel signal output from a predetermined number of the specific pixels disposed with a predetermined ratio relative to the normal pixel, and a step of performing the imaging processing on the basis of the pixel signals output from all of the plurality of pixels when a predetermined operation instructing imaging of the image is performed.

According to another aspect of the present disclosure, the solid-state image sensor includes a plurality of pixels outputting a pixel signal used to construct an image and a logic circuit driving the pixels, and is configured of a stacked structure in which a first semiconductor substrate including the plurality of pixels and a second semiconductor substrate including the logic circuit are joined together. In addition, among the plurality of pixels, a specific pixel is connected to the logic circuit independently of a normal pixel being the pixel other than the specific pixel, the specific pixel being the pixel that outputs the pixel signal used in specific processing other than imaging processing in which the image is imaged.

Effects of the Invention

According to an aspect of the present disclosure, the specific processing other than the normal imaging can be sped up with reduced power consumption.

BRIEF DESCRIPTION OF DRAWINGS

FIG. 14 is a diagram illustrating processing that corrects a specific pixel.

MODE FOR CARRYING OUT THE INVENTION

Specific embodiments applying the present technology will now be described in detail with reference to the drawings.

Figure 1:
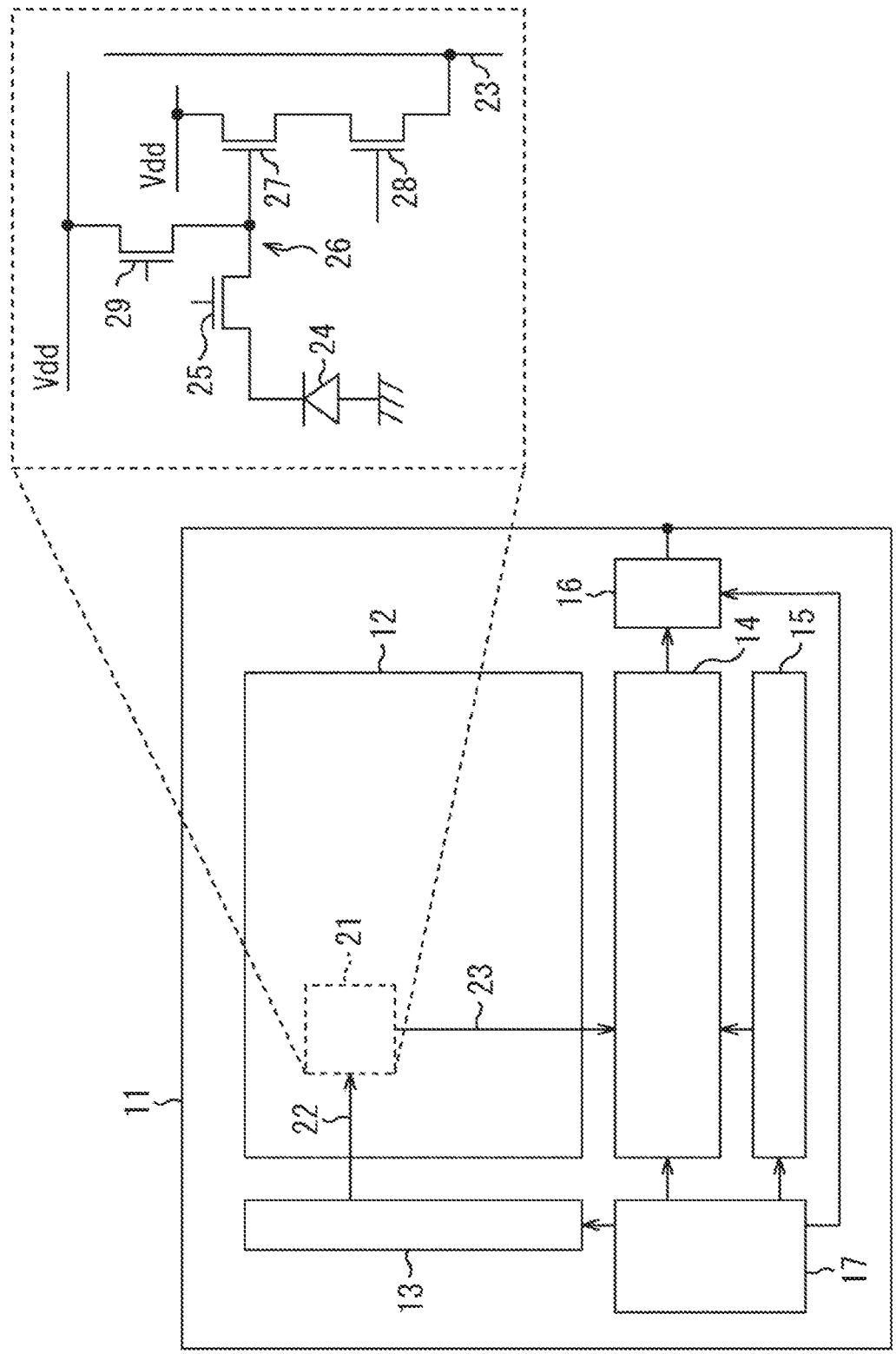
FIG. 1 is a block diagram illustrating a configuration example of an embodiment of a solid-state image sensor to which the present technology is applied.

FIG. 1 is a block diagram illustrating a configuration example of an embodiment of a solid-state image sensor to which the present technology is applied.

As illustrated in FIG. 1, a solid-state image sensor 11 is configured by including a pixel region 12, a vertical drive circuit 13, a column signal processing circuit 14, a horizontal drive circuit 15, an output circuit 16 and a control circuit 17.

A plurality of pixels 21 is arranged in an array in the pixel region 12, where each pixel 21 is connected to the vertical drive circuit 13 via a horizontal signal line 22 and to the column signal processing circuit 14 via a vertical signal line 23. Each of the plurality of pixels 21 outputs a pixel signal corresponding to an amount of light radiated through an optical system not shown, so that a subject image formed in the pixel region 12 is constructed of those pixel signals.

The pixel 21 is configured as illustrated in an enlarged view on the right side of FIG. 1, where an electric charge generated in a PD 24 being a photoelectric conversion unit is transferred to an FD 26 being a floating diffusion region via a transfer transistor 25 while driven by the vertical drive circuit 13. After that, when the pixel 21 is to be read, a selection transistor 28 is turned on while driven by the vertical drive circuit 13 so that a pixel signal of a level corresponding to the electric charge accumulated in the FD 26 is output from an amplifier transistor 27 to the vertical signal line 23 via the selection transistor 28. Moreover, the electric charge accumulated in the FD 26 is reset by turning on a reset transistor 29, whereby a pixel signal of a reset level is output from the amplifier transistor 27 to the vertical signal line 23 via the selection transistor 28.

For each row of the plurality of pixels 21 arranged in the pixel region 12, the vertical drive circuit 13 supplies a drive signal driving (such as transferring, selecting and resetting) each pixel 21 to the pixel 21 via the horizontal signal line 22. The column signal processing circuit 14 performs CDS (Correlated Double Sampling) processing on the pixel signal output from the plurality of pixels 21 via the vertical signal line 23 to perform analog-digital conversion on the pixel signal and remove reset noise.

For each column of the plurality of pixels 21 arranged in the pixel region 12, the horizontal drive circuit 15 supplies to the column signal processing circuit 14 a drive signal causing the column signal processing circuit 14 to output the pixel signal. The output circuit 16 amplifies the pixel signal supplied from the column signal processing circuit 14 at timing according to the drive signal from the horizontal drive circuit 15, and outputs the signal to a subsequent image processing circuit.

The control circuit 17 controls driving of each block in the solid-state image sensor 11. The control circuit 17 generates a clock signal in accordance with a drive cycle of each block and supplies the signal to the corresponding block.

The solid-state image sensor 11 configured as described above can image a high resolution image by using the pixel signals output from all the pixels 21. On the other hand, the solid-state image sensor 11 can perform specific processing other than normal imaging processing by using the pixel signal output from a part of the pixels 21 instead of performing the all-pixel driving as described above, the specific processing being processing that performs motion detection, processing that functions as an illuminance sensor, or processing that performs phase difference autofocus, for example (such processing will be hereinafter referred to as specific processing as appropriate).

When performing the specific processing by using the pixel signal from a part of the pixels, for example, a general solid-state image sensor needs to drive a column or row in which the part of the pixels is arranged. On the other hand, the solid-state image sensor 11 is configured to be able to drive only the part of the pixels 21 when performing the specific processing. In the following description, the pixel 21 outputting the pixel signal in the normal imaging processing will be referred to as a normal pixel 21, while the pixel 21 outputting the pixel signal in the specific processing will be referred to as a specific pixel 21X as appropriate.

A planar arrangement of the normal pixel 21 and the specific pixel 21X will be described with reference to FIG. 2.

Figure 2:
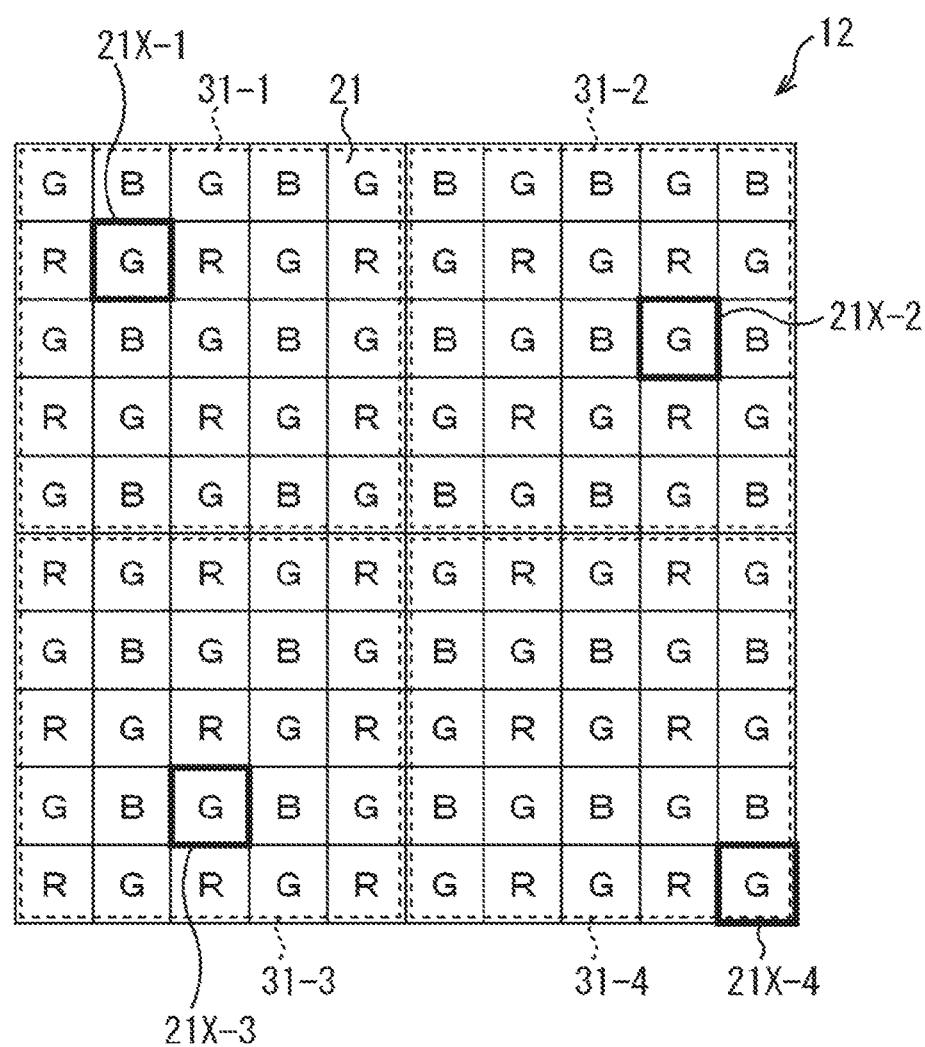
FIG. 2 is a diagram illustrating a planar arrangement of a normal pixel and a specific pixel.

FIG. 2 illustrates a part of the pixel region 12 in a planar view. Color filters transmitting red (R), green (G) and blue (B) light are arranged in a so-called Bayer array in the pixels 21 of the pixel region 12 where, in FIG. 2, a square corresponding to each color represents the pixel 21.

FIG. 2 also illustrates four specific pixels 21X-1 to 21X-4 each enclosed by a bold frame. When the specific processing is performed, each of the specific pixels 21X-1 to 21X-4 is treated as a representative of a plurality of the normal pixels 21 in each of predetermined ranges 31-1 to 31-4 in which the corresponding specific pixel is arranged. That is, as illustrated in the figure, each of the square predetermined ranges 31-1 to 31-4 is set for 25 pixels 21 in a 5×5 arrangement, where the specific pixel 21X is embedded with the ratio of one specific pixel 21X to 24 normal pixels 21.

In addition, in normal imaging, the solid-state image sensor 11 performs an all-pixel operation to output the pixel signals from all the pixels 21 (normal pixel 21 and specific pixel 21X) and image a high resolution image. In performing the specific processing, on the other hand, the solid-state image sensor 11 performs a reduction operation to output the pixel signal from only the specific pixel 21X arranged with a predetermined ratio.

Next, a circuit configuration of the solid-state image sensor 11 will be described with reference to FIG. 3.

Figure 3:
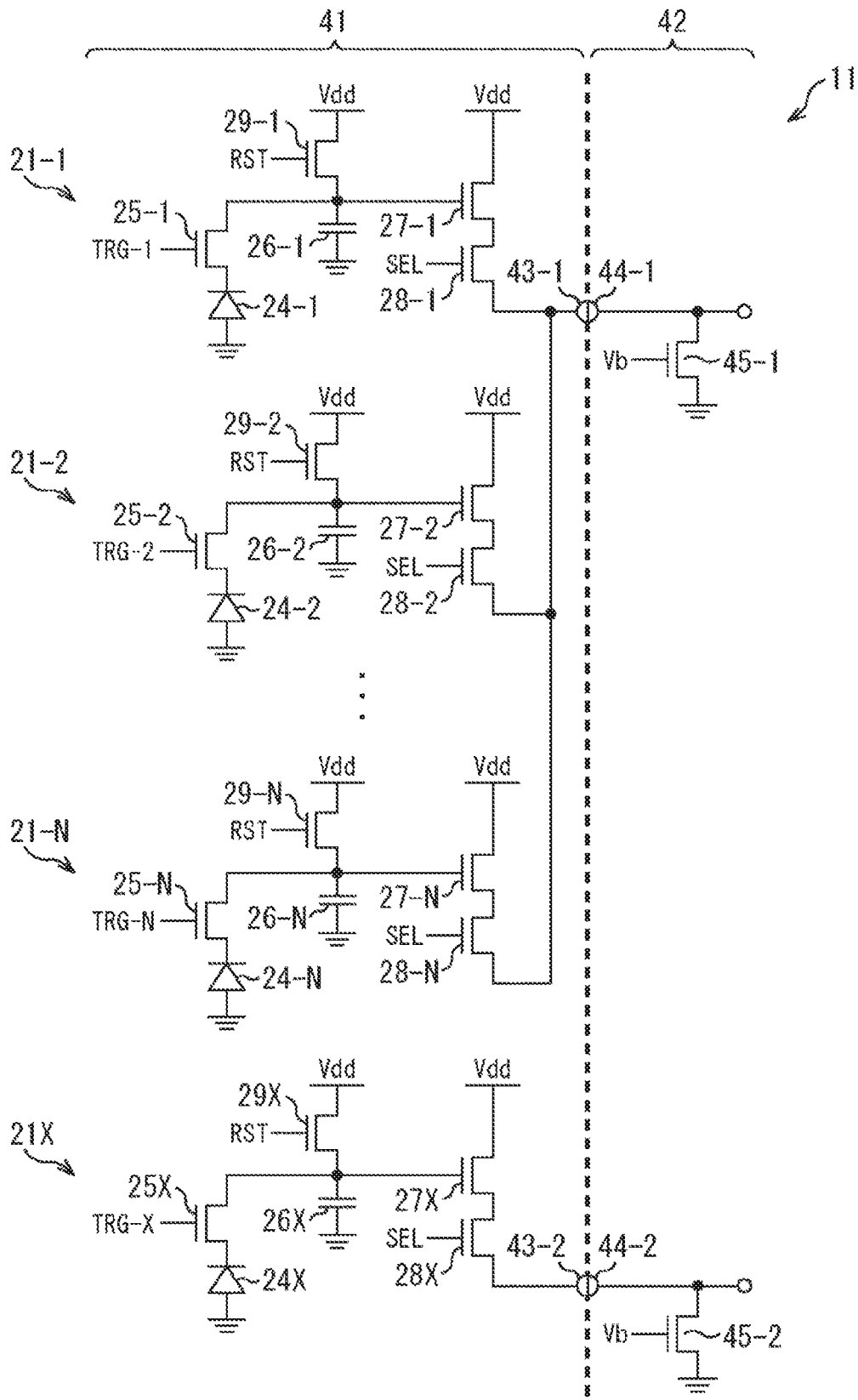
FIG. 3 is a diagram illustrating a circuit configuration of a solid-state image sensor.

FIG. 3 illustrates a configuration where N pieces of the normal pixels 21-1 to 21-N and one specific pixel 21X are arranged. Moreover, the solid-state image sensor 11 adopts a stacked structure configured by stacking a sensor substrate 41 on which a sensor such as the pixel 21 is formed and a logic substrate 42 on which a logic circuit such as the vertical drive circuit 13, the horizontal drive circuit 15 and the control circuit 17 are formed.

That is, in the solid-state image sensor 11 illustrated in FIG. 3, the normal pixels 21-1 to 21-N and the specific pixel 21X are formed on the sensor substrate 41, while bias transistors 45-1 and 45-2 functioning as a constant current source of a source follower or the like are formed on the logic substrate 42. Moreover, a bias voltage Vb is input to a gate of each of the bias transistors 45-1 and 45-2, which thus output a constant current.

As has been described with reference to FIG. 1, the normal pixels 21-1 to 21-N are configured by including PDs 24-1 to 24-N, transfer transistors 25-1 to 25-N, FDs 26-1 to 26-N, amplifier transistors 27-1 to 27-N, selection transistors 28-1 to 28-N, and reset transistors 29-1 to 29-N, respectively. In addition, the selection transistors 28-1 to 28-N of the normal pixels 21-1 to 21-N are connected to a connection terminal 43-1 formed on a bonding face of the sensor substrate 41. On the other hand, the bias transistor 45-1 on the logic substrate 42 is connected to a connection terminal 44-1 formed on a bonding face of the logic substrate 42.

Likewise, the specific pixel 21X is configured by including a PD 24X, a transfer transistor 25X, an FD 26X, an amplifier transistor 27X, a selection transistor 28X, and a reset transistor 29X. In addition, the selection transistor 28X of the specific pixel 21X is connected to a connection terminal 43-2 formed on a bonding face of the sensor substrate 41. On the other hand, the bias transistor 45-2 on the logic substrate 42 is connected to a connection terminal 44-2 formed on a bonding face of the logic substrate 42.

In addition, the sensor substrate 41 and the logic substrate 42 are bonded by a direct bonding technique which directly bonds substrates together. Note that the direct bonding technique is disclosed in detail in a patent document (JP 2000-299379 A) filed by the applicant of the present application.

The sensor substrate 41 and the logic substrate 42 are bonded in such manner to establish an electrical connection between the connection terminal 43-1 and the connection terminal 44-1 as well as an electrical connection between the connection terminal 43-2 and the connection terminal 44-2. As a result, the normal pixels 21-1 to 21-N are connected to the bias transistor 45-1 via the connection terminals 43-1 and 44-1, while the specific pixel 21X is connected to the bias transistor 45-2 via the connection terminals 43-2 and 44-2.

The solid-state image sensor 11 configured in the aforementioned manner can drive the specific pixel 21X separately from the normal pixels 21-1 to 21-N.

Figure 4:
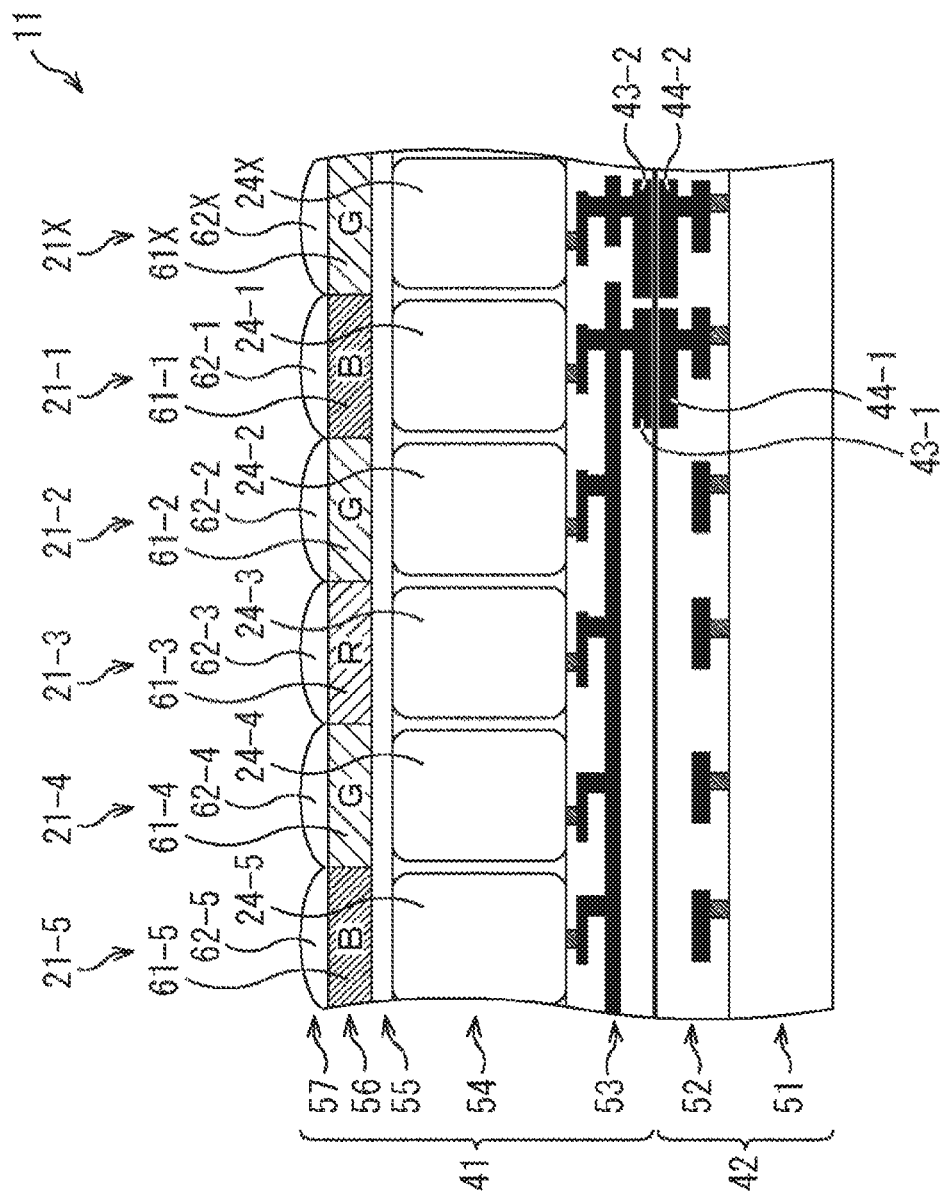
FIG. 4 is a diagram illustrating a cross-sectional configuration of the solid-state image sensor.

FIG. 4 illustrates an example of a cross-sectional configuration of the solid-state image sensor 11.

As illustrated in FIG. 4, the solid-state image sensor 11 is configured by stacking the sensor substrate 41 and the logic substrate 42.

The logic substrate 42 is configured by stacking a semiconductor layer 51 and a wiring layer 52 in this order from the bottom of FIG. 4. A device (not shown) such as a transistor making up the logic circuit is configured in the semiconductor layer 51, while a wiring connecting the device and the connection terminals 44-1 and 44-2 is formed in the wiring layer 52.

The sensor substrate 41 is configured by stacking a wiring layer 53, a semiconductor substrate 54, an insulating layer 55, a color filter layer 56 and an on-chip lens layer 57 in this order from the bottom of FIG. 4. The example in FIG. 4 illustrates the five normal pixels 21-1 to 21-5 and the specific pixel 21X out of the plurality of pixels 21 formed on the sensor substrate 41.

A wiring connected to the connection terminals 43-1 and 43-2 is formed in the wiring layer 53 so that, as illustrated in the figure, the normal pixels 21-1 to 21-5 are connected to the connection terminal 43-1 via the wiring while the specific pixel 21X is connected to the connection terminal 43-2 via the wring.

The PDs 24-1 to 24-5 and the PD 24X corresponding to the normal pixels 21-1 to 21-5 and the specific pixel 21X are formed on the semiconductor substrate 54. The insulating layer 55 insulates a light-receiving surface (surface on an upper side in FIG. 4) of the semiconductor substrate 54.

Filters 61-1 to 61-5 and a filter 61X corresponding to the normal pixels 21-1 to 21-5 and the specific pixel 21X are formed in the color filter layer 56, each of the filters transmitting light of a corresponding color. On-chip lenses 62-1 to 62-5 and an on-chip lens 62X corresponding to the normal pixels 21-1 to 21-5 and the specific pixel 21X are formed in the on-chip lens layer 57, each of the on-chip lenses concentrating light radiated onto the pixel.

As a result, in the solid-state image sensor 11, the sensor substrate 41 and the logic substrate 42 are bonded together to establish an electrical connection between the normal pixels 21-1 to 21-5 and the logic substrate 42 via the connection terminals 43-1 and 44-1 and an electrical connection between the specific pixel 21X and the logic substrate 42 via the connection terminals 43-2 and 44-2. In other words, in the solid-state image sensor 11, the normal pixels 21-1 to 21-5 and the specific pixel 21X are configured to be separately connected to the logic substrate 42.

The solid-state image sensor 11 can thus read the pixel signal output from the specific pixel 21X independently of the normal pixels 21-1 to 21-5. That is, the solid-state image sensor 11 can drive the specific pixel 21X independently of a column in which the specific pixel 21X is arranged, instead of driving the entire column. By driving the specific pixel 21X independently of the column, the solid-state image sensor 11 can perform the processing of reading the pixel signal at high speed, for example.

Figure 5:
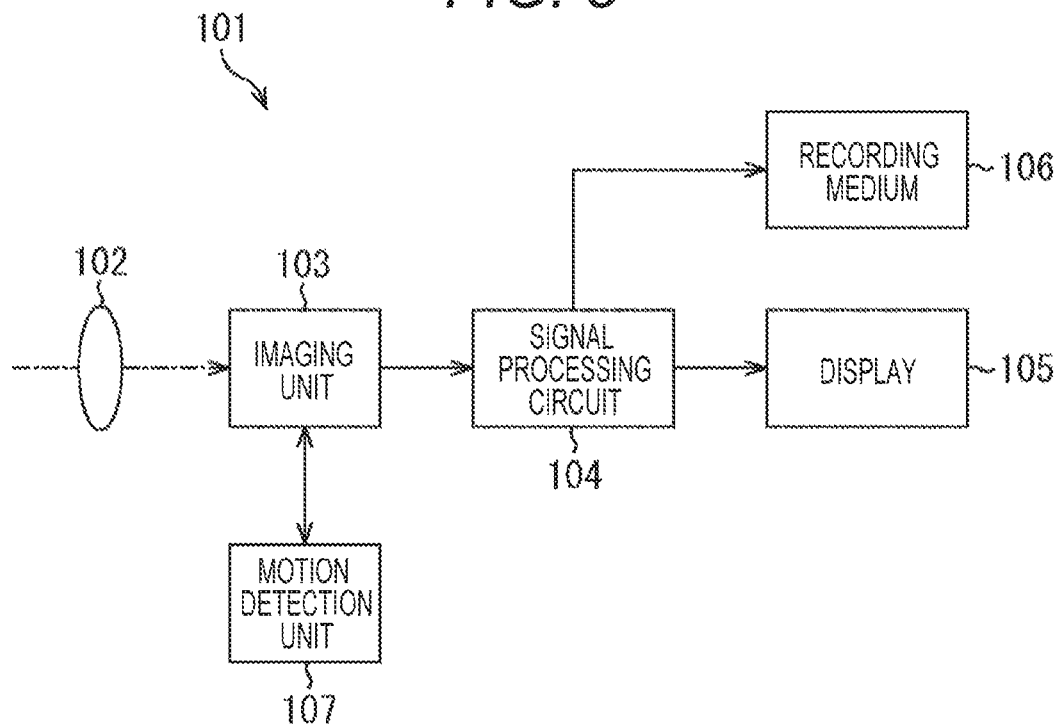
FIG. 5 is a block diagram illustrating a first configuration example of an imaging apparatus.

FIG. 5 is a block diagram illustrating a first configuration example of an imaging apparatus equipped with the solid-state image sensor 11.

As illustrated in FIG. 5, an imaging apparatus 101 is configured by including an optical system 102, an imaging unit 103, a signal processing circuit 104, a display 105, a recording medium 106 and a motion detection unit 107 to be able to image a still image and a dynamic image.

The optical system 102 configured by including one or a plurality of lenses to guide image light (incident light) from a subject to the imaging unit 103 and form an image on a light-receiving surface (sensor unit) of the imaging unit 103.

The imaging unit 103 accumulates electrons for a certain period of time according to the image formed on the light-receiving surface via the optical system 102, and supplies a signal corresponding to the accumulated electrons to the signal processing circuit 104 and the motion detection unit 107. The aforementioned solid-state image sensor 11 can be applied as the imaging unit 103, which will thus be hereinafter referred to as the solid-state image sensor 11 as well. The solid-state image sensor 11 outputs the pixel signal from only the specific pixel 21X until timing to store the image and, according to the timing to store the image, supplies the pixel signals output from all the pixels 21 (normal pixel 21 and specific pixel 21X) to the signal processing circuit 104.

The signal processing circuit 104 constructs an image on the basis of the pixel signals output from the solid-state image sensor 11 and performs various signal Processings including white balance adjustment and gamma correction. When the pixel signal from only the specific pixel 21X is supplied, for example, the signal processing circuit 104 supplies a low resolution image constructed of the pixel signal to the display 105, which performs a live view display of the image. Moreover, when the pixel signals output from all the pixels 21 are supplied, the signal processing circuit 104 supplies a high resolution image constructed of the pixel signals to the recording medium 106, which then stores (records) the image.

The motion detection unit 107 performs motion detection processing that detects a motion of a user, for example, and determines whether or not an imaging motion being a predetermined motion that triggers image storage is performed. The pixel signal of only the specific pixel 21X is supplied from the solid-state image sensor 11 to the motion detection unit 107, so that the motion detection unit 107 detects the motion of the user captured in the image on the basis of the image configured of the pixel signal from only the specific pixel 21X.

Note that as described above, the solid-state image sensor 11 is configured by stacking the sensor substrate 41 and the logic substrate 42, where the signal processing circuit 104 and the motion detection unit 107 can be formed on the logic substrate 42. That is, instead of the configuration where only the imaging unit 103 corresponds to the solid-state image sensor 11, the imaging unit 103, the signal processing circuit 104 and the motion detection unit 107 can be configured to be incorporated into the solid-state image sensor 11 made from a single chip.

Figure 6:
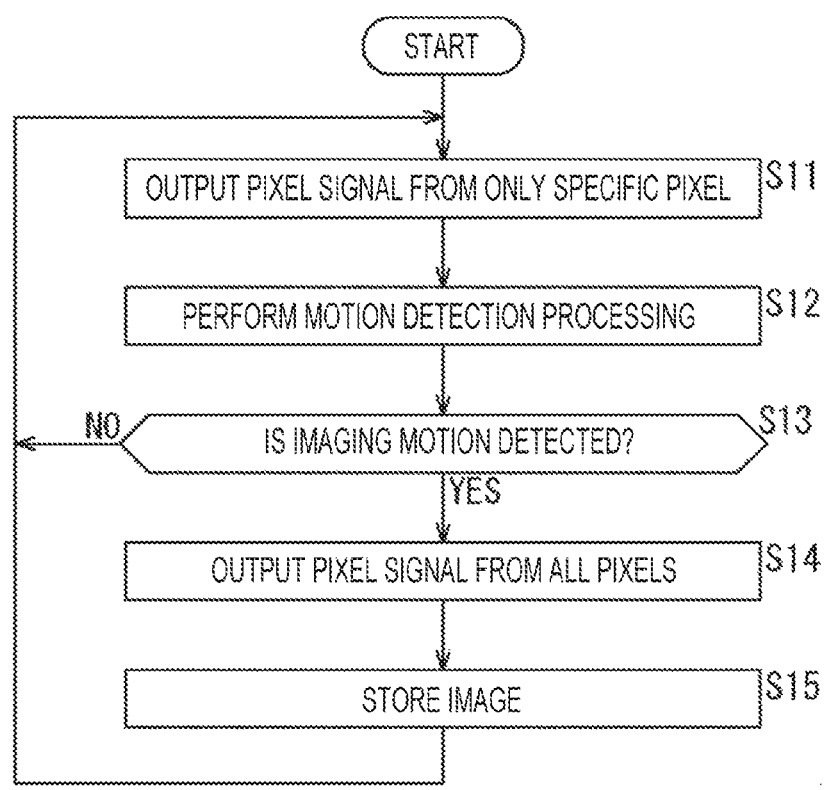
FIG. 6 is a flowchart illustrating a first imaging method.

Now, FIG. 6 is a flowchart illustrating imaging processing (a first imaging method) by which the imaging apparatus 101 stores an image when the imaging motion is performed by the user.

The processing starts once the user operates the imaging apparatus 101 and selects a mode which stores the image when the imaging motion is performed, for example. In addition, in step S11, the solid-state image sensor 11 outputs the pixel signal of only the specific pixel 21X to the signal processing circuit 104 and the motion detection unit 107.

In step S12, the motion detection unit 107 performs the motion detection processing that detects the motion of the user on the basis of the image configured of only the pixel signal from the specific pixel 21X supplied from the solid-state image sensor 11. The motion detection unit 107 for example keeps images configured of only the pixel signal from the specific pixel 21X and detects the motion of the user by finding a difference among the images at a stage a predetermined number of images are accumulated.

In step S13, on the basis of a result of the motion detection processing in step S12, the motion detection unit 107 determines whether or not a predetermined imaging motion (such as a hand waving motion) which instructs imaging is performed by the user.

When the motion detection unit 107 determines in step S13 that the predetermined imaging motion is not performed by the user, the processing returns to step S11 to repeat similar processing from then on and successively supply the pixel signal from only the specific pixel 21X to the motion detection unit 107. On the other hand, the processing proceeds to step S14 when the motion detection unit 107 determines in step S13 that the predetermined imaging motion is performed by the user.

In step S14, the motion detection unit 107 instructs the solid-state image sensor 11 to perform all-pixel drive, so that the solid-state image sensor 11 supplies the pixel signals output from all the pixels 21 (normal pixel 21 and specific pixel 21X) to the signal processing circuit 104.

In step S15, the signal processing circuit 104 supplies, to the recording medium 106, the image constructed of the pixel signals supplied from the solid-state image sensor 11 in step S14, and causes the recording medium to store the image. The processing thereafter returns to step S11, from which on similar processing is repeated.

According to the imaging apparatus 101 described above, the solid-state image sensor 11 is configured to be able to drive the specific pixel 21X separately and thus output the pixel signal from only the specific pixel 21X until it is determined that the imaging motion is performed by the user. In addition, when the imaging motion is performed by the user, the imaging apparatus 101 performs the imaging processing that images the image on the basis of the pixel signals output from all of the plurality of pixels 21. The imaging apparatus 101 can therefore perform the motion detection processing by using the image constructed of only the pixel signal output from the specific pixel 21X, and speed up the processing with lower power consumption compared to the configuration in which all the pixels 21 are driven, for example.

Figure 7:
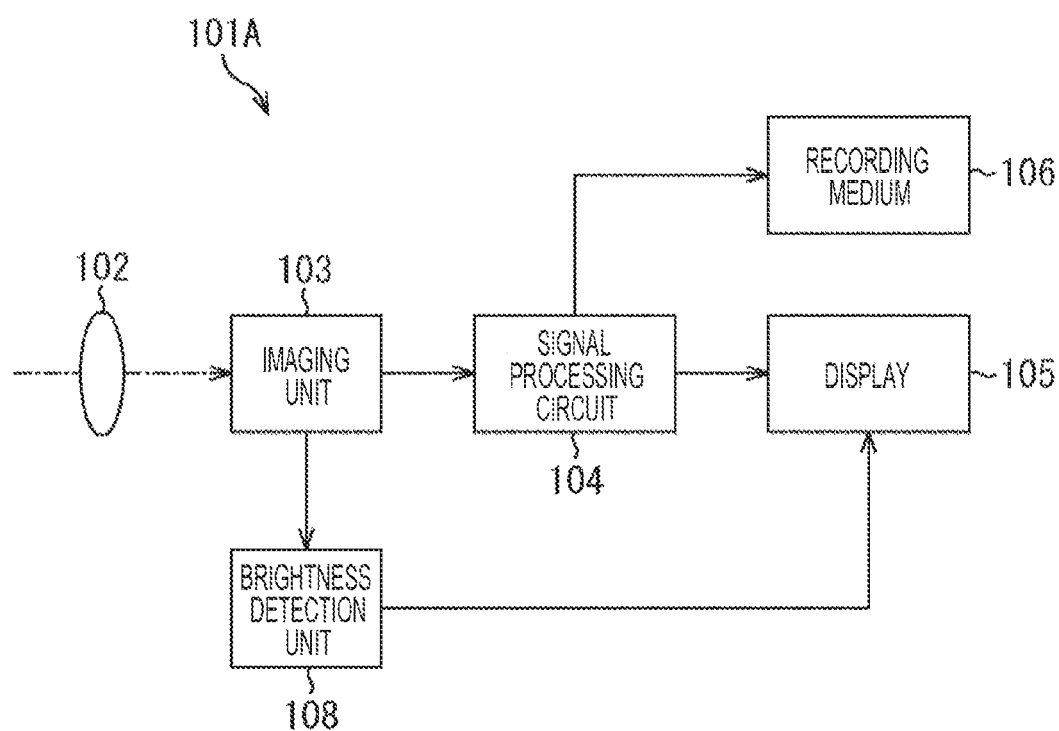
FIG. 7 is a block diagram illustrating a second configuration example of an imaging apparatus.

FIG. 7 is a block diagram illustrating a second configuration example of an imaging apparatus equipped with the solid-state image sensor 11.

In an imaging apparatus 101A illustrated in FIG. 7, a configuration common to that of the imaging apparatus 101 in FIG. 5 will be assigned the same reference numeral as that assigned thereto and will not be described in detail. That is, the imaging apparatus 101A is common to the imaging apparatus 101 in FIG. 5 in that the optical system 102, the imaging unit 103 (the solid-state image sensor 11 is applied, for example), the signal processing circuit 104, the display 105 and the recording medium 106 are included. Note however that the imaging apparatus 101A has a different configuration from the imaging apparatus 101 in FIG. 5 in that a brightness detection unit 108 is included.

The brightness detection unit 108 for example performs illuminance detection processing that detects ambient illuminance of an environment in which the imaging apparatus 101A is installed on the basis of brightness of the pixel signal from the specific pixel 21X supplied from the solid-state image sensor 11, and performs an operation based on the illuminance. According to a change in the illuminance detected by the illuminance detection processing, the brightness detection unit 108 performs an operation to decrease the brightness of the display 105 when the illuminance is decreased, or increase the brightness of the display 105 when the illuminance is increased, for example. Note that as described above, the imaging unit 103, the signal processing circuit 104 and the brightness detection unit 108 can be configured to be incorporated into the solid-state image sensor 11 made from a single chip.

Figure 8:
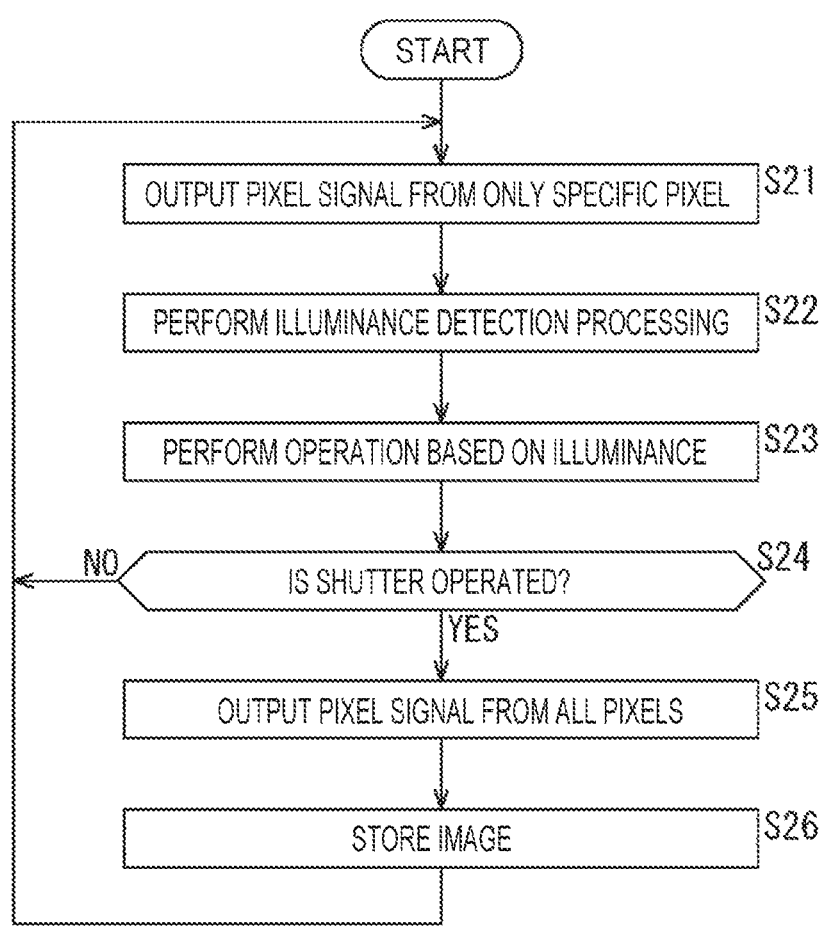
FIG. 8 is a flowchart illustrating a second imaging method.

Now, FIG. 8 is a flowchart illustrating processing (a second imaging method) by which the imaging apparatus 101A performs the operation based on the ambient illuminance of the environment in which the imaging apparatus 101A is installed.

The processing starts once the user operates the imaging apparatus 101A and selects a mode which performs the operation based on the ambient illuminance of the environment in which the imaging apparatus 101A is installed, for example. In addition, in step S21, the solid-state image sensor 11 outputs the pixel signal from only the specific pixel 21X to the signal processing circuit 104 and the brightness detection unit 108.

In step S22, the brightness detection unit 108 performs the illuminance detection processing that detects the ambient illuminance of the environment in which the imaging apparatus 101A is installed, on the basis of the brightness of the pixel signal from the specific pixel 21X that is supplied from the solid-state image sensor 11.

In step S23, the brightness detection unit 108 performs the operation based on the illuminance detected in the illuminance detection processing performed in step S12. According to a change in the illuminance detected by the illuminance detection processing, the brightness detection unit 108 performs an operation to decrease the brightness of the display 105 when the illuminance is decreased, or increase the brightness of the display 105 when the illuminance is increased, for example.

In step S24, it is determined whether or not a shutter is operated by the user as an operation instructing imaging. When the shutter of the imaging apparatus 101A is operated by the user, for example, an operation control unit (not shown) outputs an operation signal indicating that the shutter is operated, whereby the imaging apparatus 101A determines that the shutter is operated by the user.

When it is determined in step S24 that the shutter is not operated by the user, the processing returns to step S21 to repeat similar processing from then on. On the other hand, the processing proceeds to step S25 when it is determined in step S24 that the shutter is operated by the user.

In step S25, the solid-state image sensor 11 supplies the pixel signals output from all the pixels 21 (normal pixel 21 and specific pixel 21X) to the signal processing circuit 104.

In step S26, the signal processing circuit 104 supplies, to the recording medium 106, the image constructed of the pixel signals supplied from the solid-state image sensor 11 in step S25, and causes the recording medium to store the image. The processing thereafter returns to step S21 to repeat similar processing from then on.

The imaging apparatus 101A can perform the illuminance detection processing on the basis of the brightness of the pixel signal output from the specific pixel 21X, as described above. The imaging apparatus 101A can therefore speed up the processing with lower power consumption compared to the configuration in which all the pixels 21 are driven to perform the illuminance detection processing on the basis of the brightness of the pixel signals output from all the pixels 21, for example. Furthermore, the imaging apparatus 101A need only be able to detect the illuminance and can thus perform more addition processing by the solid-state image sensor 11 than the motion detection processing while omitting installation of an illuminance sensor used only for detecting illuminance.

Figure 9:
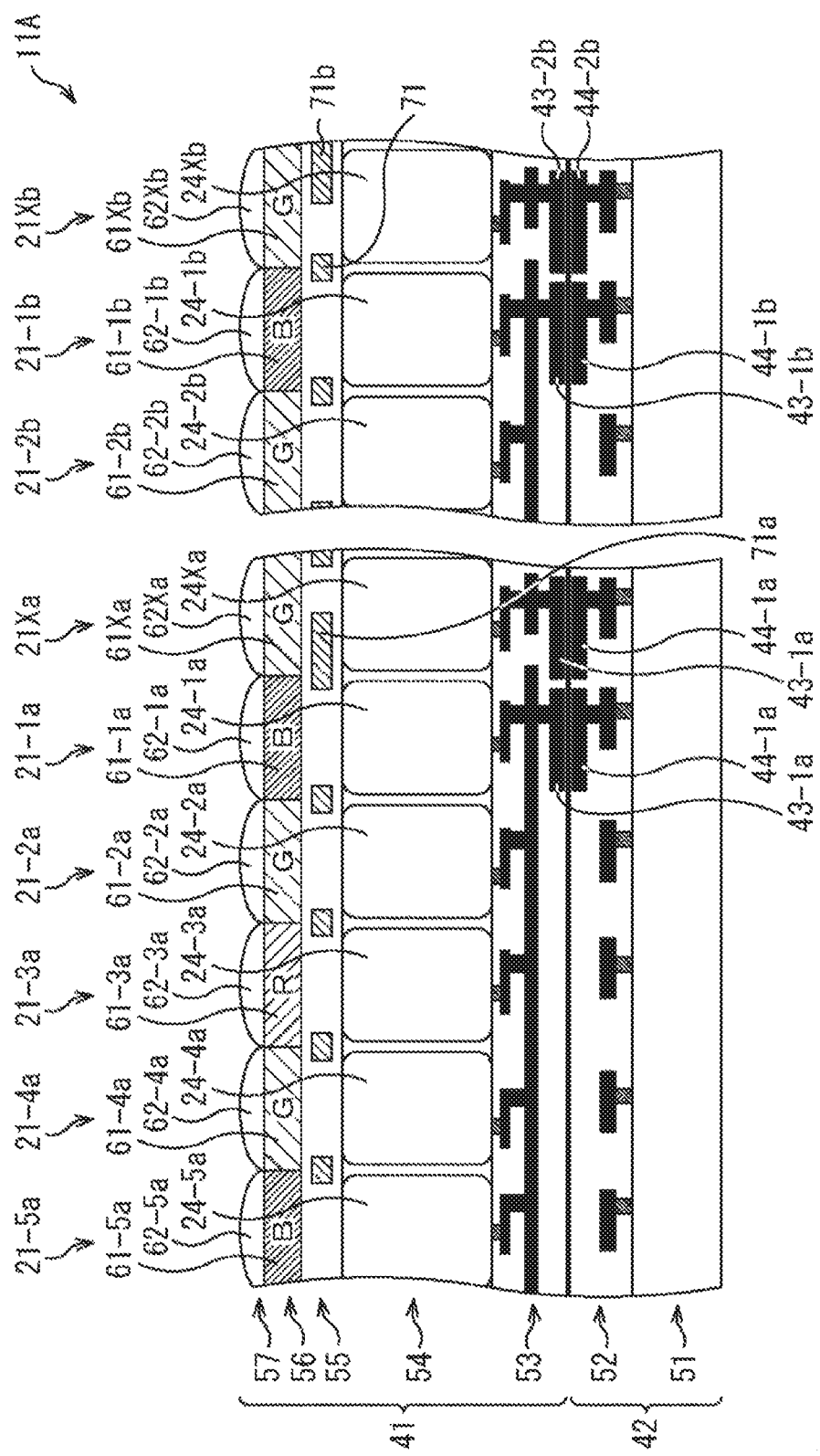
FIG. 9 is a diagram illustrating a cross-sectional configuration of a solid-state image sensor according to a first variation.

FIG. 9 illustrates a cross-sectional configuration of a solid-state image sensor according to a first variation.

In the cross-sectional structure of a solid-state image sensor 11A in FIG. 9, a configuration common to that in the solid-state image sensor 11 in FIG. 4 will be assigned the same reference numeral as that assigned thereto and will not be described in detail. That is, the solid-state image sensor 11A is common to the solid-state image sensor 11 in FIG. 4 in that it is configured by stacking the sensor substrate 41 and the logic substrate 42, the logic substrate 42 is configured by stacking the semiconductor layer 51 and the wiring layer 52, and the sensor substrate 41 is configured by stacking the wiring layer 53, the semiconductor substrate 54, the insulating layer 55, the color filter layer 56, and the on-chip lens layer 57. Moreover, the solid-state image sensor 11A is common to the solid-state image sensor 11 in FIG. 4 in that the PD 24, the filter 61 and the on-chip lens 62 are disposed for each pixel 21.

The solid-state image sensor 11A has a different configuration from the solid-state image sensor 11 in FIG. 4 in that a light-shielding film 71 shielding incident light from an adjacent pixel 21 is formed between pixels 21 adjacent to each other in the insulating layer 55, a light-shielding film 71a shields a substantially left half of an opening in a specific pixel 21Xa, and a light-shielding film 71b shields a substantially right half of an opening in a specific pixel 21Xb.

That is, in the solid-state image sensor 11A, a pair of the specific pixel 21Xa and the specific pixel 21Xb are used in imaging surface phase difference AF (Auto Focus) which performs AF processing on the basis of a phase difference detected on an imaging surface. A first phase difference image is constructed of a pixel signal that is output from the specific pixel 21Xa embedded at a plurality of sites in the solid-state image sensor 11A and is formed of light, a part of which corresponding to the left half of the opening is shielded, for example. Likewise, a second phase difference image is constructed of a pixel signal that is output from the specific pixel 21Xb embedded at a plurality of sites in a solid-state image sensor 11B and is formed of light, a part of which corresponding to the right half of the opening is shielded, for example. In addition, AF control can then be performed by measuring a distance to a subject on the basis of a difference between a position of the subject captured in the first phase difference image and a position of the subject captured in the second phase difference image.

In addition, the solid-state image sensor 11A is configured such that the specific pixel 21Xa and the specific pixel 21Xb are connected to the logic substrate 42 separately from a normal pixel 21, similar to the specific pixel 21X in FIG. 4. Note that the pair of the specific pixel 21Xa and the specific pixel 21Xb may be connected by wiring (not shown) and connected to the logic substrate 42 separately from the normal pixel 21 via a common connection terminal. Moreover, the light-shielding film 71a in the specific pixel 21Xa and the light-shielding film 71b in the specific pixel 21Xb may be formed to shield light for at least a part of the opening to an extent allowing for acquisition of the phase difference image, unlike the light-shielding region in the pixel 21.

Figure 10:
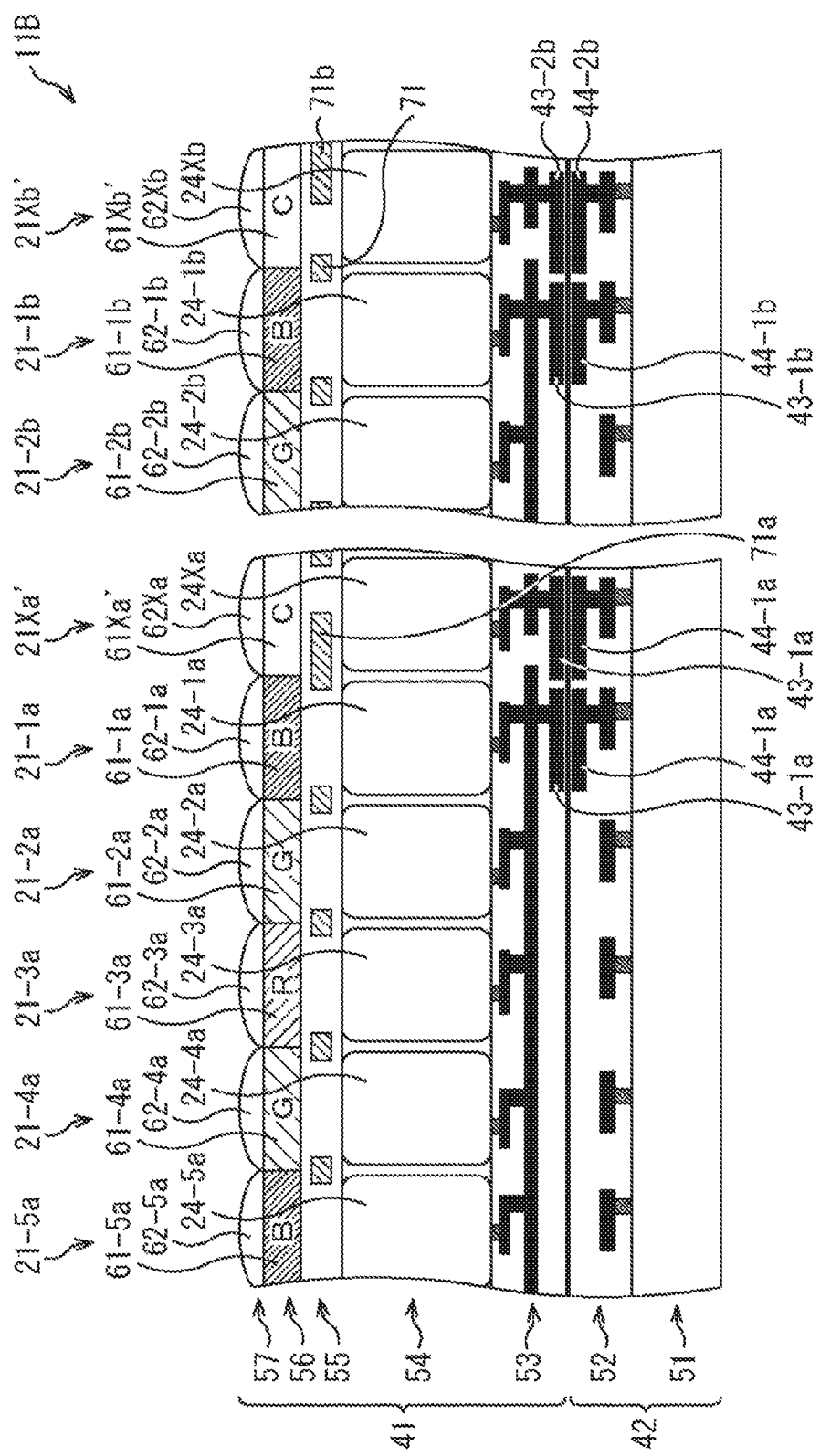
FIG. 10 is a diagram illustrating a cross-sectional configuration of a solid-state image sensor according to a second variation.

FIG. 10 illustrates a cross-sectional configuration of a solid-state image sensor according to a second variation.

In the cross-sectional structure of a solid-state image sensor 11B in FIG. 10, a configuration common to that in the solid-state image sensor 11A in FIG. 9 will be assigned the same reference numeral as that assigned thereto and will not be described in detail.

That is, the solid-state image sensor 11B has a different configuration from the solid-state image sensor 11A in FIG. 9 in that colorless (clear) filters 61Xa' and 61Xb' are disposed in specific pixels 21Xa' and 21Xb', respectively. Instead of the filter 61 transmitting light of a predetermined color in the normal pixel 21, the solid-state image sensor 11B uses the filters 61Xa' and 61Xb' with excellent light transparency to be able to improve sensitivity of the specific pixels 21Xa' and 21Xb'. As a result, focusing accuracy of the imaging surface phase difference AF can be improved to be able to accurately control a focus even in a low illuminance environment, for example.

Figure 11:
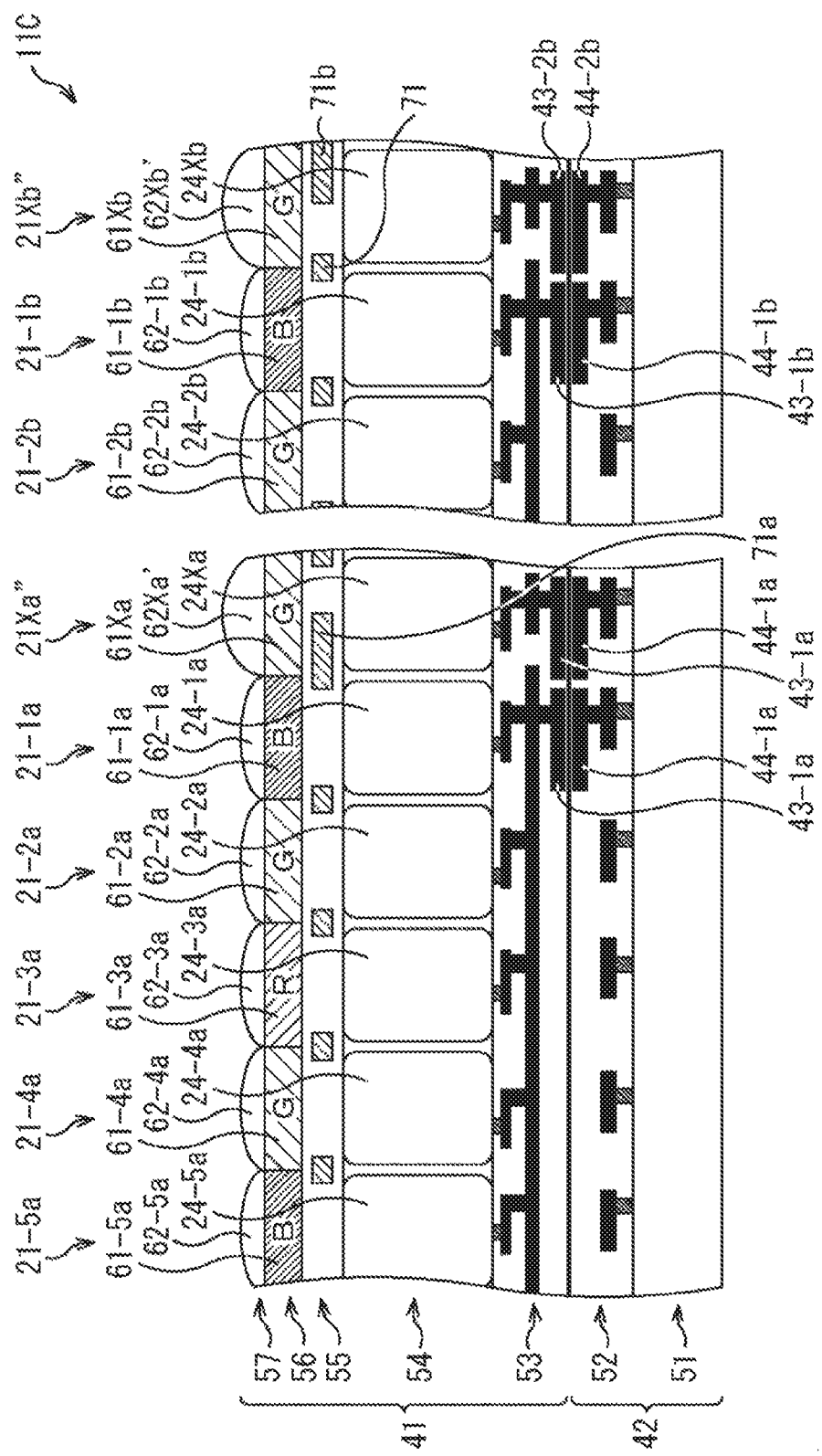
FIG. 11 is a diagram illustrating a cross-sectional configuration of a solid-state image sensor according to a third variation.

FIG. 11 illustrates a cross-sectional configuration of a solid-state image sensor according to a third variation.

In the cross-sectional structure of a solid-state image sensor 11C in FIG. 11, a configuration common to that in the solid-state image sensor 11A in FIG. 9 will be assigned the same reference numeral as that assigned thereto and will not be described in detail.

That is, the solid-state image sensor 11C has a different configuration from the solid-state image sensor 11A in FIG. 9 in that on-chip lenses 62Xa' and 62Xb' having a different optical characteristic from the on-chip lens 62 in the normal pixel 21 are disposed in specific pixels 21Xa" and 21Xb", respectively. In the solid-state image sensor 11C, for example, a curvature of each of the on-chip lenses 62Xa' and 62Xb' is adjusted in order for light to be condensed to an end face shielded from light by each of the light-shielding films 71a and 71b. Alternatively, in the solid-state image sensor 11C, a height of each of the on-chip lenses 62Xa' and 62Xb' disposed is adjusted in order for light to be condensed to the end face shielded from light by each of the light-shielding films 71a and 71b. The insulating layer 55 stacked on the semiconductor substrate 54 can be formed to have a different thickness between the specific pixel 21X and the normal pixel 21 to thus allow light to be condensed to the end face shielded from light by the light-shielding films 71a and 71b, for example. As a result, the solid-state image sensor 11C can acquire a more accurate phase difference image to be able to improve the focusing accuracy of the imaging surface phase difference AF.

Note that the specific pixel 21X may also be structured differently from the normal pixel 21 besides disposing, in the specific pixel 21X, the filter 61 transmitting different light and the on-chip lens 62 having the different optical characteristic from those in the normal pixel 21. An electric charge accumulation time for which the PD 24X of the specific pixel 21X performs a photoelectric conversion and accumulates an electric charge can be set differently from an electric charge accumulation time relevant to the PD 24 of the normal pixel 21, for example. Specifically, for example, the electric charge accumulation time can be set short for the specific pixel 21X performing high-speed driving, whereas the electric charge accumulation time can be set long for the normal pixel 21 to acquire an image with higher sensitivity. Moreover, for example, a potential of the PD 24X in the specific pixel 21X can be different from a potential of the PD 24 in the normal pixel 21. The potential of the PD 24X in the specific pixel 21X can be formed at a shallow depth to be able to reliably transfer the electric charge even at the time of high-speed driving, for example.

Figure 12:
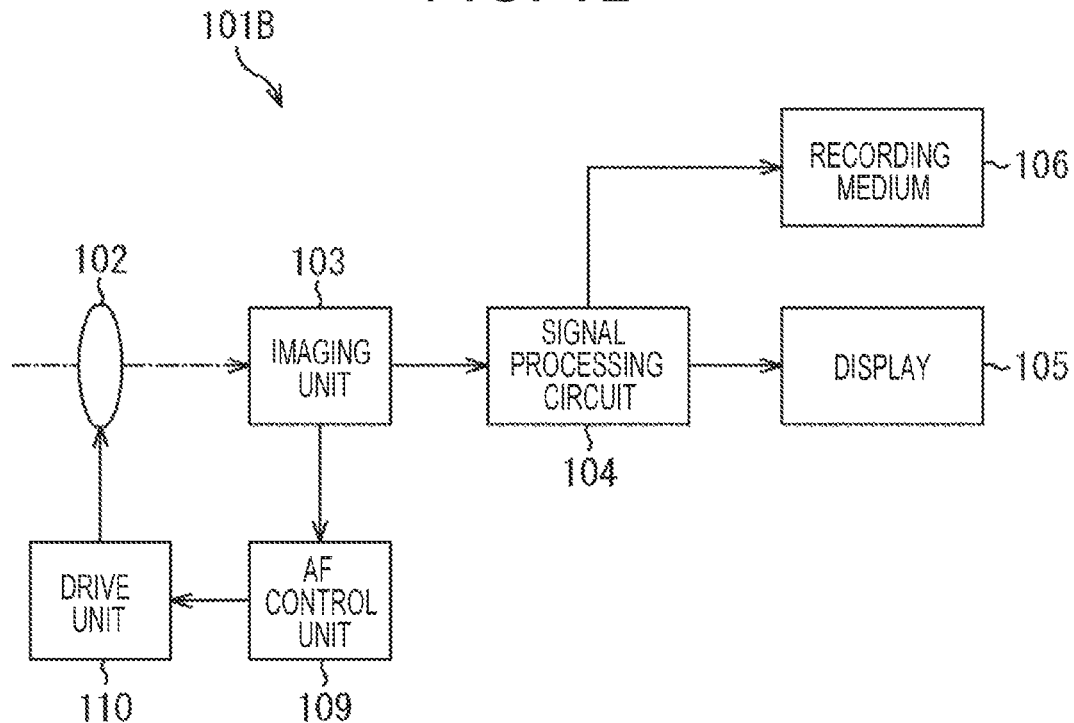
FIG. 12 is a block diagram illustrating a third configuration example of an imaging apparatus.

FIG. 12 is a block diagram illustrating a third configuration example of an imaging apparatus equipped with the solid-state image sensor 11A in FIG. 9, for example.

In an imaging apparatus 101B illustrated in FIG. 12, a configuration common to that of the imaging apparatus 101 in FIG. 5 will be assigned the same reference numeral as that assigned thereto and will not be described in detail. That is, the imaging apparatus 101B is common to the imaging apparatus 101 in FIG. 5 in that the optical system 102, the imaging unit 103 (the solid-state image sensor 11A is applied, for example), the signal processing circuit 104, the display 105 and the recording medium 106 are included. Note however that the imaging apparatus 101B has a different configuration from the imaging apparatus 101 in FIG. 5 in that an AF control unit 109 and a drive unit 110 are included.

The pixel signal from each of the specific pixel 21Xa and the specific pixel 21Xb is supplied from the solid-state image sensor 11A to the AF control unit 109. The AF control unit 109 finds a difference between a subject captured in a phase difference image configured of the pixel signal from the specific pixel 21Xa and a subject captured in a phase difference image configured of the pixel signal from the specific pixel 21Xb, and calculates a distance to the subject. In addition, on the basis of the calculated distance to the subject, the AF control unit 109 performs AF processing (focus processing) in which the drive unit 110 is controlled to bring the subject into focus.

The drive unit 110 drives an AF lens included in the optical system 102 under control of the AF control unit 109. Note that the imaging unit 103, the signal processing circuit 104 and the AF control unit 109 can be configured to be incorporated into the solid-state image sensor 11 made from a single chip.

Figure 13:
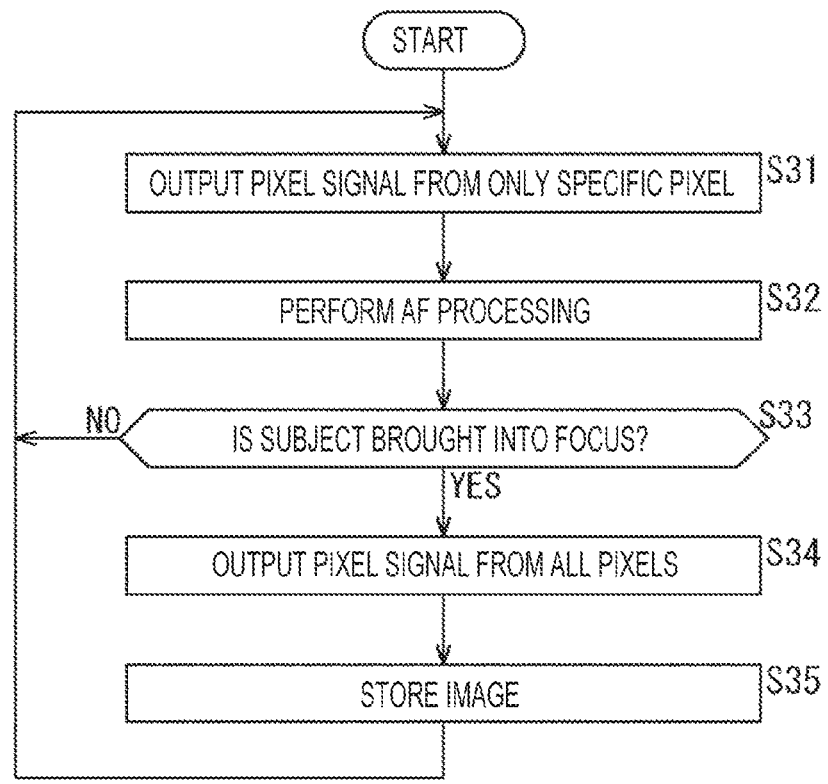
FIG. 13 is a flowchart illustrating a third imaging method.

FIG. 13 is a flowchart illustrating processing (a third imaging method) by which the imaging apparatus 101B performs the imaging surface phase difference AF.

The processing starts once a user operates the imaging apparatus 101B and selects an AF mode, for example, then in step S31, the solid-state image sensor 11A outputs the pixel signals from only the specific pixel 21Xa and the specific pixel 21Xb to the AF control unit 109.

In step S32, the AF control unit 109 calculates the distance to the subject on the basis of the difference in the positions of the subject captured in each of a pair of phase difference images constructed of the pixel signals from the specific pixel 21Xa and the specific pixel 21Xb. In addition, the AF control unit 109 controls the drive unit 110 to bring the subject into focus on the basis of the calculated distance to the subject, so that the drive unit 110 performs the AF processing that drives the AF lens included in the optical system 102 under control of the AF control unit 109.

In step S33, the AF control unit 109 determines whether or not the subject is brought into focus on the basis of the phase difference image acquired after the AF processing performed in step S32. In addition, when the AF control unit 109 determines that the subject is not brought into focus, the processing returns to step S31 to repeat similar processing from then on. On the other hand, the processing proceeds to step S34 when the AF control unit 109 determines in step S33 that the subject is brought into focus.

In step S34, the AF control unit 109 instructs the solid-state image sensor 11A to perform all-pixel drive, so that the solid-state image sensor 11A supplies the pixel signals output from all the pixels 21 (normal pixel 21 and specific pixels 21Xa and 21Xb) to the signal processing circuit 104.

In step S35, the signal processing circuit 104 supplies, to the recording medium 106, the image constructed of the pixel signals supplied from the solid-state image sensor 11 in step S34, and causes the recording medium to store the image. The processing thereafter returns to step S31 to repeat similar processing from then on.

The imaging apparatus 101B can perform the AF processing by using the image configured of only the pixel signals output from the specific pixels 21Xa and 21Xb, as described above. As a result, the AF processing can be sped up to be able to bring the subject into focus in a shorter time compared to AF processing which drives all the pixels 21 and uses an image configured of the pixel signals output from all the pixels, for example. Moreover, the pixels can be driven with low power consumption as well.

Processing by which the specific pixel 21X is corrected will now be described with reference to FIG. 14.

In the solid-state image sensor 11, for example, the specific pixel 21X is connected to the logic substrate 42 differently from the normal pixel 21 and thus has a pixel characteristic different from that of the normal pixel 21. The pixel signal of the specific pixel 21X is thus different from the pixel signal of the normal pixel 21 even when receiving light of the same illuminance, for example, whereby a correction is required to construct an accurate image. Accordingly, the solid-state image sensor 11 can construct a more accurate image by performing correction processing that corrects the pixel signal of the specific pixel 21X on the basis of the pixel signal of the normal pixel 21 which is in the vicinity of the specific pixel 21X and receives light of the same color as that received by the specific pixel 21X.

Figure 14:
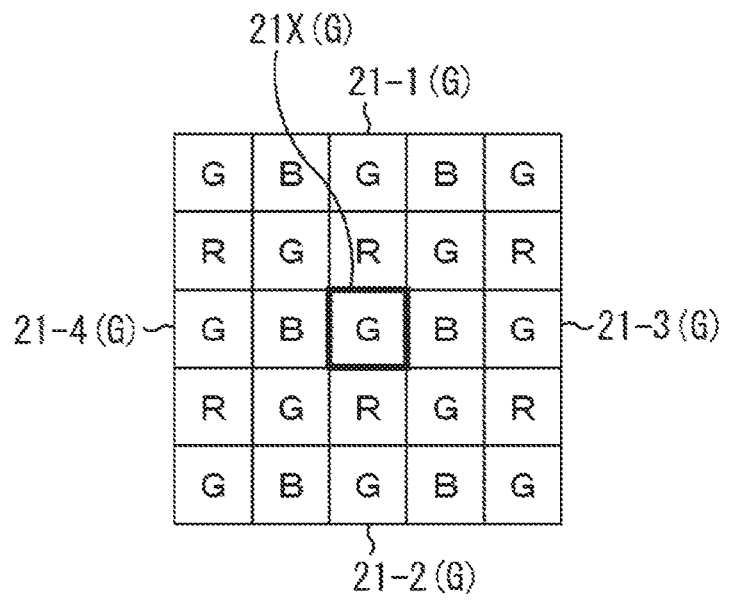

As illustrated in FIG. 14, for example, a specific pixel 21X (G) being a correction target and receiving light of a green color can be subjected to the correction processing that corrects the pixel characteristic by using a pixel signal output from a normal pixel 21-1 (G) separated from the specific pixel by one pixel thereabove and receiving light of a green color, a pixel signal output from a normal pixel 21-2 (G) separated from the specific pixel by one pixel therebelow and receiving light of a green color, a pixel signal output from a normal pixel 21-3 (G) separated from the specific pixel by one pixel to the right thereof and receiving light of a green color, and a pixel signal output from a normal pixel 21-4 (G) separated from the specific pixel by one pixel to the left thereof and receiving light of a green color. Note that the correction processing may be performed by using another normal pixel 21 or employing another correction method. Moreover, the correction processing against the pixel signal can be performed by the signal processing circuit 104 in FIG. 5, or a circuit performing the correction processing can be incorporated into the logic substrate 42 of the solid-state image sensor 11, for example.

Furthermore, for example, the correction processing may be performed on the normal pixels 21 around the specific pixel 21X by using a pixel signal of another normal pixel 21 that is in the vicinity of those normal pixels 21 and receives light of the same color. That is, the specific pixel 21X is assumed to have an effect on the surrounding normal pixels 21 so that, in such case, a more accurate image can be constructed by performing the correction processing on the normal pixels 21 surrounding the specific pixel 21X.

Figure 15:
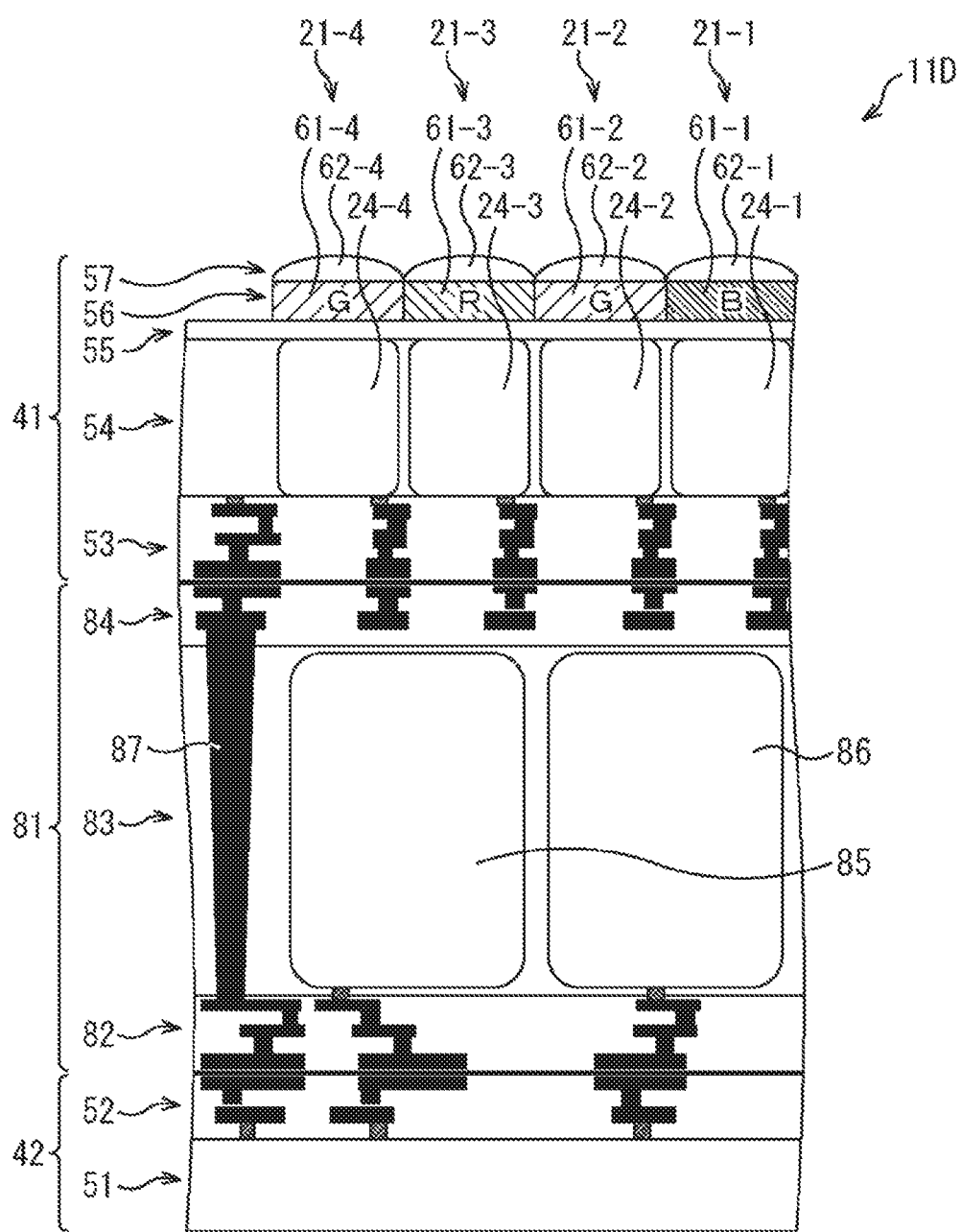
FIG. 15 is a diagram illustrating a cross-sectional configuration of a solid-state image sensor according to a fourth variation.

FIG. 15 is a diagram illustrating a cross-sectional configuration of a solid-state image sensor according to a fourth variation.

In the cross-sectional structure of a solid-state image sensor 11D in FIG. 15, a configuration common to that in the solid-state image sensor 11 in FIG. 4 will be assigned the same reference numeral as that assigned thereto and will not be described in detail. That is, the solid-state image sensor 11D is common to the solid-state image sensor 11 in FIG. 4 in that it includes the sensor substrate 41 and the logic substrate 42, the logic substrate 42 is configured by stacking the semiconductor layer 51 and the wiring layer 52, and the sensor substrate 41 is configured by stacking the wiring layer 53, the semiconductor substrate 54, the insulating layer 55, the color filter layer 56, and the on-chip lens layer 57. Moreover, the solid-state image sensor 11D is common to the solid-state image sensor 11 in FIG. 4 in that the PD 24, the filter 61 and the on-chip lens 62 are disposed for each pixel 21.

The solid-state image sensor 11D is however configured to be different from the solid-state image sensor 11 in FIG. 4 in that an infrared sensor substrate 81 is disposed between the sensor substrate 41 and the logic substrate 42.

The infrared sensor substrate 81 is configured by stacking a wiring layer 82, a semiconductor layer 83 and a wiring layer 84 in this order from the bottom of FIG. 15, where infrared PDs 85 and 86 are formed in the semiconductor layer 83. The infrared PDs 85 and 86 detect infrared light reaching a deep region of the solid-state image sensor 11D. A pixel signal of the infrared light output from the infrared PDs 85 and 86 can be used as an surveillance camera or a sensor measuring a distance to an object, for example. Moreover, a through electrode 87 passing through the infrared sensor substrate 81 is formed in a peripheral portion of the solid-state image sensor 11D to electrically connect the sensor substrate 41 and the logic substrate 42.

The solid-state image sensor 11D having the aforementioned configuration can be configured to separately drive the specific pixel 21X (not shown in FIG. 15) disposed on the sensor substrate 41 similar to the solid-state image sensor 11 in FIG. 4, or separately drive either one of the infrared PDs 85 and 86 formed in the infrared sensor substrate 81. Alternatively, the solid-state image sensor 11D may be configured to separately drive both the specific pixel 21X (not shown in FIG. 15) disposed on the sensor substrate 41 and either one of the infrared PDs 85 and 86 formed in the infrared sensor substrate 81.

Figure 16:
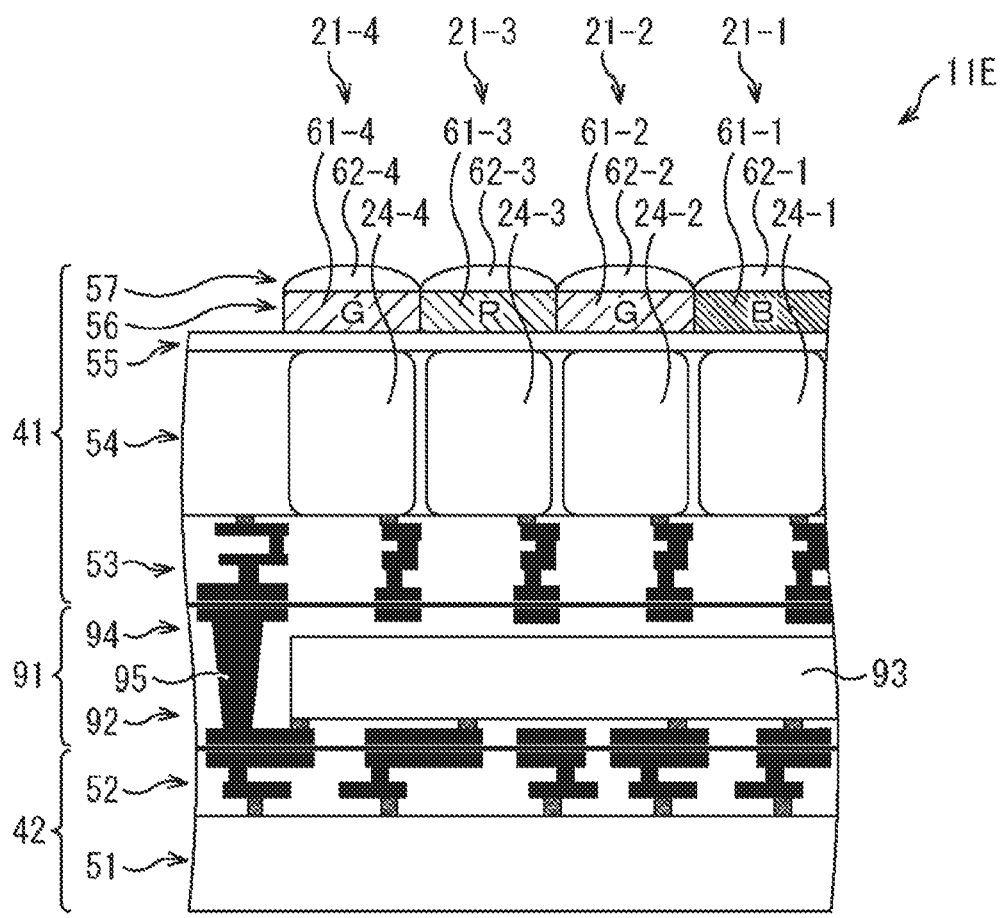
FIG. 16 is a diagram illustrating a cross-sectional configuration of a solid-state image sensor according to a fifth variation.

FIG. 16 is a diagram illustrating a cross-sectional configuration of a solid-state image sensor according to a fifth variation.

In the cross-sectional structure of a solid-state image sensor 11E in FIG. 16, a configuration common to that in the solid-state image sensor 11 in FIG. 4 will be assigned the same reference numeral as that assigned thereto and will not be described in detail. That is, the solid-state image sensor 11E is common to the solid-state image sensor 11 in FIG. 4 in that it includes the sensor substrate 41 and the logic substrate 42, the logic substrate 42 is configured by stacking the semiconductor layer 51 and the wiring layer 52, and the sensor substrate 41 is configured by stacking the wiring layer 53, the semiconductor substrate 54, the insulating layer 55, the color filter layer 56, and the on-chip lens layer 57. Moreover, the solid-state image sensor 11E is common to the solid-state image sensor 11 in FIG. 4 in that the PD 24, the filter 61 and the on-chip lens 62 are disposed for each pixel 21.

The solid-state image sensor 11E is however configured to be different from the solid-state image sensor 11 in FIG. 4 in that an infrared sensor substrate 91 is disposed between the sensor substrate 41 and the logic substrate 42.

The infrared sensor substrate 91 is configured by stacking a wiring layer 92, a compound semiconductor layer 93 and a wiring layer 94 in this order from the bottom of FIG. 16. The compound semiconductor layer 93 is configured of InGaAs (Indium Gallium Arsenide), for example, and detects infrared light reaching a deep region of the solid-state image sensor 11E. In addition, the compound semiconductor layer 93 functions as an infrared PD for each corresponding pixel 21 and outputs a pixel signal of the infrared light for each infrared PD. The pixel signal of the infrared light output from the compound semiconductor layer 93 can be used as an surveillance camera or a sensor measuring a distance to an object, for example. Moreover, a through electrode 95 passing through the infrared sensor substrate 91 is formed in a peripheral portion of the solid-state image sensor 11E to electrically connect the sensor substrate 41 and the logic substrate 42.

The solid-state image sensor 11E having the aforementioned configuration can be configured to separately drive the specific pixel 21X (not shown in FIG. 16) disposed on the sensor substrate 41 similar to the solid-state image sensor 11 in FIG. 4, or separately drive the infrared PD of the compound semiconductor layer 93 formed in the infrared sensor substrate 91. Alternatively, the solid-state image sensor 11D may be configured to separately drive the specific pixel 21X (not shown in FIG. 16) disposed on the sensor substrate 41 and the infrared PD of the compound semiconductor layer 93 formed in the infrared sensor substrate 91.

Figure 17:
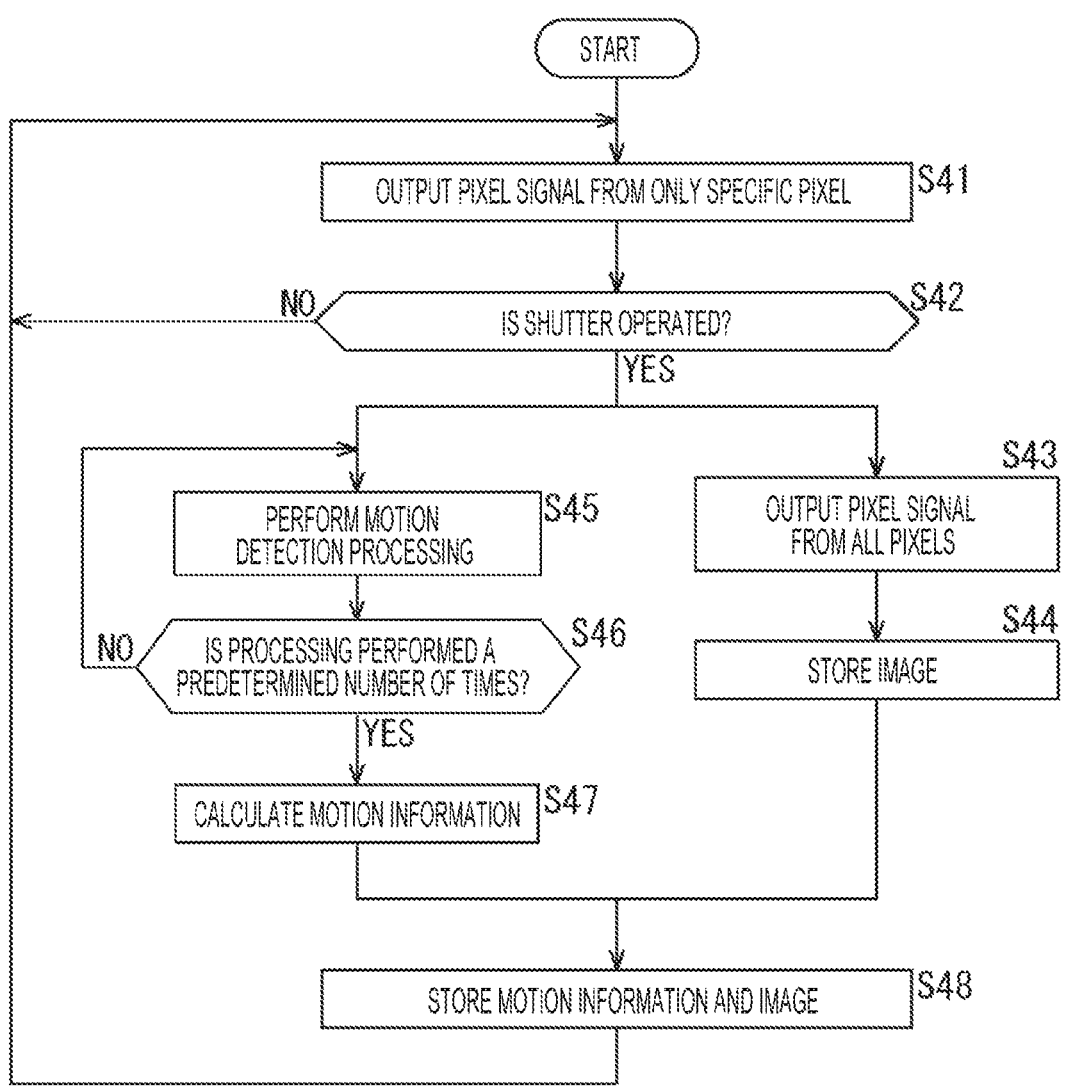
FIG. 17 is a flowchart illustrating a fourth imaging method.

Next, a fourth imaging method will be described with reference to a flowchart in FIG. 17.

The processing starts once a mode which stores motion information along with an image is selected in the imaging apparatus 101 in FIG. 5, for example, then in step S41, the solid-state image sensor 11 outputs the pixel signal from only the specific pixel 21X to the signal processing circuit 104 and the motion detection unit 107.

In step S42, it is determined whether or not a shutter is operated by a user and, when determined that the shutter is not operated by the user, the processing returns to step S41 to repeat similar processing from then on. On the other hand, the processing proceeds to steps S43 and S45 when it is determined in step S42 that the shutter is operated by the user.

Processings in steps S43 and S44 are performed concurrently with Processings from steps S45 to S47.

In step S43, the solid-state image sensor 11 supplies the pixel signals output from all the pixels 21 (normal pixel 21 and specific pixel 21X) to the signal processing circuit 104. In step S44, the signal processing circuit 104 supplies, to the recording medium 106, the image constructed of the pixel signals supplied from the solid-state image sensor 11 in step S43, and causes the recording medium to store the image.

On the other hand, in step S45, the motion detection unit 107 performs motion detection processing that detects a motion of the user on the basis of the image configured from only the pixel signal of the specific pixel 21X supplied from the solid-state image sensor 11.

In step S46, the motion detection unit 107 determines whether or not the motion detection processing is performed a predetermined number of times, and repeats the motion detection processing until it is performed the predetermined number of times when the motion detection processing is determined to be performed less than the predetermined number of times. The motion detection processing can be driven at high speed as described above and can thus be performed a plurality of times while the pixel signals are output from all the pixels 21 in step S43 and the image is stored in step S44.

The processing proceeds to step S47 when the motion detection unit 107 determines in step S46 that the motion detection processing is performed the predetermined number of times, whereby the motion detection unit 107 calculates the motion information from the motion detected in the motion detection processing that is performed the plurality of times.

After performing the processing in each of steps S44 and S47, the processing proceeds to step S48 in which the motion information calculated in step S47 and the image constructed in step S43 are stored as a set in the recording medium 106. In addition, the processing returns to step S41 after performing the processing in step S48, whereby similar processing is repeated from then on.

The imaging apparatus 101 can drive the specific pixel 21X at high speed as described above, and can thus acquire the motion information on the basis of the pixel signal output from the specific pixel 21X while normal imaging is performed. As a result, the motion at the time the subject is imaged can be stored along with the image. Note that in the fourth imaging method, the processing in step S41 may be omitted to instead start the processing once the operation on the shutter is detected. Moreover, in the fourth imaging method, the motion detection processing in step S45 may be performed the predetermined number of times in succession without performing the determination processing in step S46.

Figure 18:
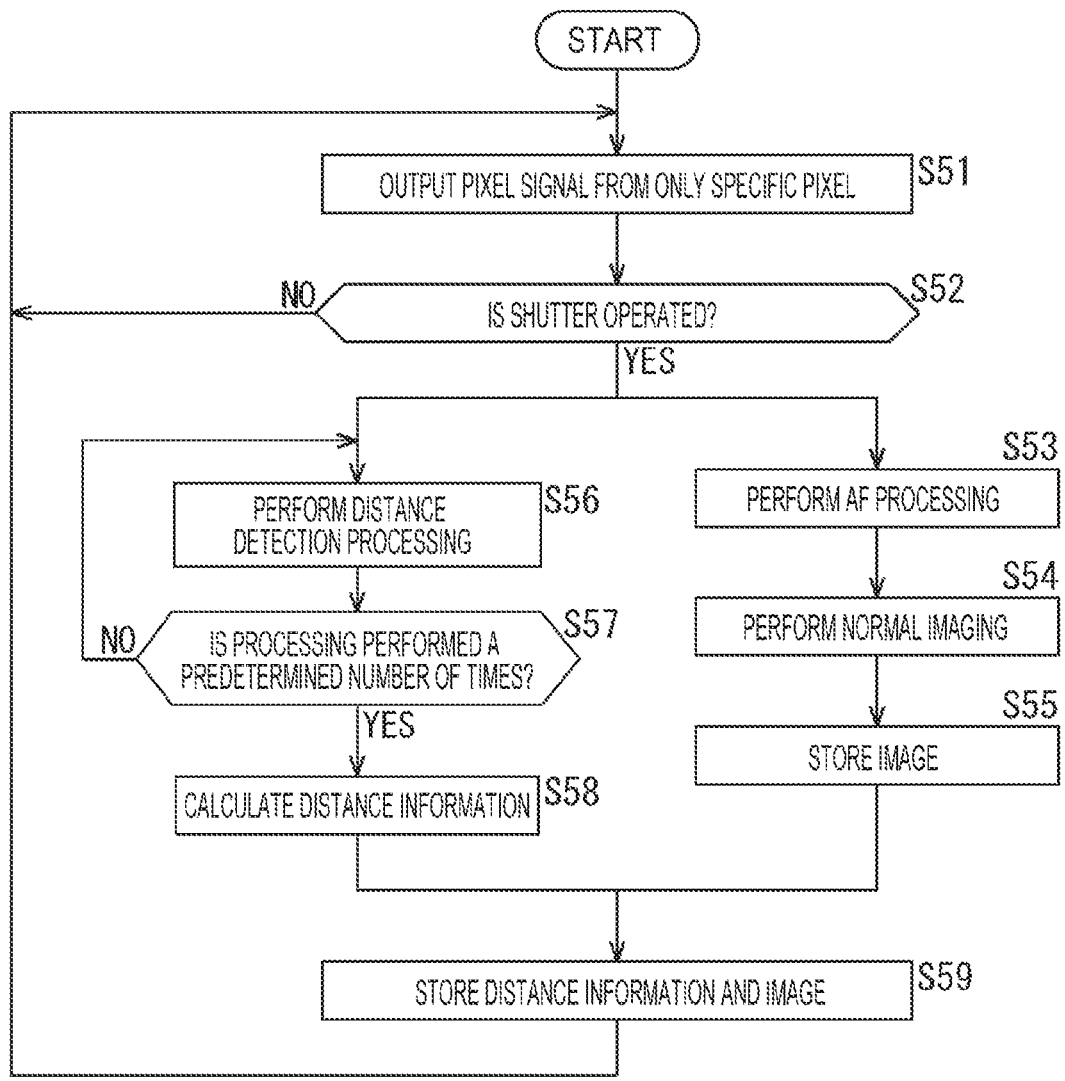
FIG. 18 is a flowchart illustrating a fifth imaging method.

Next, a fifth imaging method will be described with reference to a flowchart in FIG. 18.

The processing starts once a mode which stores distance information along with an image is selected in the imaging apparatus 101B in FIG. 12, for example, then in step S51, the solid-state image sensor 11A outputs the pixel signals from only the specific pixels 21Xa and 21Xb to the signal processing circuit 104 and the AF control unit 109.

In step S52, it is determined whether or not a shutter is operated by a user and, when determined that the shutter is not operated by the user, the processing returns to step S51 to repeat similar processing from then on. On the other hand, the processing proceeds to steps S53 and S56 when it is determined in step S52 that the shutter is operated by the user.

Processings from steps S53 to S55 are performed concurrently with Processings from steps S56 to S58.

In step S53, the AF control unit 109 calculates a distance to a subject on the basis of the difference in the positions of the subject captured in each of a pair of phase difference images constructed of the pixel signals from the specific pixels 21Xa and 21Xb. In addition, the AF control unit 109 controls the drive unit 110 to bring the subject into focus on the basis of the calculated distance to the subject, so that the drive unit 110 performs the AF processing that drives the AF lens included in the optical system 102 under control of the AF control unit 109. The processing proceeds to step S54 once the subject is brought into focus as a result of the AF processing.

In step S54, the AF control unit 109 instructs the solid-state image sensor 11A to perform all-pixel drive, so that the solid-state image sensor 11A supplies the pixel signals output from all the pixels 21 (normal pixel 21 and specific pixels 21Xa and 21Xb) to the signal processing circuit 104. In step S55, the signal processing circuit 104 supplies, to the recording medium 106, the image constructed of the pixel signals supplied from the solid-state image sensor 11A in step S54, and causes the recording medium to store the image.

On the other hand, in step S56, the AF control unit 109 performs distance detection processing that calculates the distance to the subject on the basis of the difference in the positions of the subject captured in each of the pair of phase difference images constructed of the pixel signals from the specific pixels 21Xa and 21Xb.

In step S57, the AF control unit 109 determines whether or not the distance detection processing is performed a predetermined number of times, and repeats the distance detection processing until it is performed the predetermined number of times when the distance detection processing is determined to be performed less than the predetermined number of times. The distance detection processing can be driven at high speed as described above, and can thus be performed a plurality of times while the Processings from steps S53 to step S55 are performed.

The processing proceeds to step S58 when the AF control unit 109 determines in step S57 that the distance detection processing is performed the predetermined number of times, then the AF control unit 109 calculates the distance information (information including a change in the distance to the subject when the subject moves along an optical axis) from the distance detected in the distance detection processing that is performed the plurality of times.

After performing the processing in each of steps S55 and S58, the processing proceeds to step S59 in which the distance information calculated in step S58 and the image constructed in step S54 are stored as a set in the recording medium 106. In addition, the processing returns to step S51 after performing the processing in step S59, whereby similar processing is repeated from then on. Note that in the fifth imaging method, the processing may start in response to detecting the operation on the shutter, without performing the processing in step S51. Moreover, in the fifth imaging method, the distance detection processing in step S56 may be performed the predetermined number of times in succession without performing the determination processing in step S57.

The imaging apparatus 101B can drive the specific pixels 21Xa and 21Xb at high speed as described above, and can thus acquire a plurality of pieces of the distance information on the basis of the pixel signals output from the specific pixels 21Xa and 21Xb while normal imaging is performed. As a result, the change in the distance to the subject at the time the subject is imaged can be stored along with the image. Information on the distance to the subject in sync with a movement of the AF lens can be recorded along with the image as a set, for example.

Note that each processing described with reference to the aforementioned flowchart need not be performed chronologically in the order listed in the flowchart but includes processing executed concurrently or separately (such as parallel processing or processing performed by an object). Moreover, a program may be processed by a single CPU (Central Processing Unit) or processed in a distributed manner by a plurality of CPUs.

Moreover, besides the imaging apparatus 101, an electronic apparatus performing imaging as a main function and an electronic apparatus such as a mobile phone or a multi-functional mobile terminal called a smart phone or tablet equipped with an imaging function can be adapted as the solid-state image sensor 11, for example.

Note that the present technology can have the following configuration as well.

(1)

A solid-state image sensor including:

a pixel outputting a pixel signal used to construct an image; and a logic circuit driving the pixel, where the solid-state image sensor is configured of a stacked structure in which a first semiconductor substrate including a plurality of the pixels and a second semiconductor substrate including the logic circuit are joined together, and a specific pixel among the plurality of the pixels is connected to the logic circuit independently of a normal pixel being the pixel other than the specific pixel, the specific pixel being the pixel that outputs the pixel signal used in specific processing other than imaging processing in which the image is imaged.

(2)

The solid-state image sensor described in (1) above, where the specific processing is performed on the basis of the pixel signal output from a predetermined number of the specific pixels disposed at a predetermined ratio relative to the normal pixel, and the imaging processing is performed on the basis of pixel signals output from all of the plurality of the pixels when a predetermined operation instructing imaging of the image is performed.

(3)

The solid-state image sensor described in (1) or (2) above, where the specific processing is motion detection processing that detects a motion of a subject captured in the image.

(4)

The solid-state image sensor described in (1) or (2) above, where the specific processing is illuminance detection processing that detects ambient illuminance of an environment in which an electronic apparatus equipped with the image sensor is placed.

(5)

The solid-state image sensor described in (1) or (2) above, where the specific pixel is a phase difference pixel used to acquire a phase difference image that is constructed of a pixel signal obtained while shielding radiated light at a region corresponding to a part of an opening, and the specific processing is focus processing that brings a subject into focus on the basis of a difference in a position of the subject captured in each of a pair of the phase difference images constructed of the pixel signal output from the phase difference pixel.

(6)

The solid-state image sensor described in (5) above, where a light-shielding region formed of a light-shielding film disposed in the specific pixel is different from a light-shielding region formed of a light-shielding film disposed in the normal pixel, and shields at least a part of the opening of the specific pixel.

(7)

The solid-state image sensor described in (5) or (6) above, where a color of light transmitted through a filter disposed in the specific pixel is different from a color of light transmitted through a filter disposed in the normal pixel.

(8)

The solid-state image sensor described in any of (5) to (7) above, where an optical characteristic of an on-chip lens disposed on the specific pixel is different from an optical characteristic of an on-chip lens disposed on the normal pixel.

(9)

The solid-state image sensor described in any of (5) to (8) above, where an insulating film stacked on a semiconductor substrate configuring the first semiconductor substrate has a different thickness between the specific pixel and the normal pixel.

(10)

The solid-state image sensor described in any of (1) to (9) above, where an accumulation time for which a photoelectric conversion unit included in the specific pixel performs a photoelectric conversion to accumulate an electric charge is different from the accumulation time in the normal pixel.

(11)

The solid-state image sensor described in any of (1) to (10) above, where a potential of the photoelectric conversion unit included in the specific pixel is different from a potential of a photoelectric conversion unit included in the normal pixel.

(12)

The solid-state image sensor described in any of (1) to (11) above, where the pixel signal output from the specific pixel is corrected by using the pixel signal from a predetermined normal pixel in the vicinity of the specific pixel.

(13)

The solid-state image sensor described in any of (1) to (12) above, where the pixel signal output from the normal pixel around the specific pixel is corrected by using a pixel signal from a predetermined normal pixel in the vicinity of the normal pixel around the specific pixel.

(14)

The solid-state image sensor described in any of (1) to (12) above, where there is stacked a third semiconductor substrate including another pixel formed at a position deeper than the pixel in the first semiconductor substrate.

(15)

An electronic apparatus including a solid-state image sensor including:

a pixel outputting a pixel signal used to construct an image; and a logic circuit driving the pixel, where the solid-state image sensor is configured of a stacked structure in which a first semiconductor substrate including a plurality of the pixels and a second semiconductor substrate including the logic circuit are joined together, and a specific pixel among the plurality of the pixels is connected to the logic circuit independently of a normal pixel being the pixel other than the specific pixel, the specific pixel being the pixel that outputs the pixel signal used in specific processing other than imaging processing in which the image is imaged.

(16)

An imaging method employed by a solid-state image sensor that includes a plurality of pixels outputting a pixel signal used to construct an image and a logic circuit driving the pixel, and is configured of a stacked structure in which a first semiconductor substrate including the plurality of pixels and a second semiconductor substrate including the logic circuit are joined together, while at the same time a specific pixel among the plurality of pixels is connected to the logic circuit independently of a normal pixel being the pixel other than the specific pixel being the pixel that outputs the pixel signal used in specific processing other than imaging processing in which the image is imaged, the method including the steps of:

performing the specific processing on the basis of the pixel signal output from a predetermined number of the specific pixels disposed with a predetermined ratio relative to the normal pixel; and performing the imaging processing on the basis of the pixel signals output from all of the plurality of pixels when a predetermined operation instructing imaging of the image is performed.

(17)

The imaging method described in (16) above, where the specific processing is motion detection processing that detects a motion of a subject captured in the image, and the method includes a step of storing motion information acquired in the motion detection processing along with an image imaged in the imaging processing.

(18)

The imaging method described in (16) above, where the specific pixel is a phase difference pixel used to acquire a phase difference image that is constructed of a pixel signal obtained by shielding radiated light at a region corresponding to a part of an opening, the specific processing is focus processing that brings a subject into focus on the basis of a difference in a position of the subject captured in each of a pair of the phase difference images constructed of the pixel signal output from the phase difference pixel, and the method includes a step of storing motion information acquired in the focus processing along with an image imaged in the imaging processing.

Note that the present embodiment is not limited to the aforementioned embodiment, where various modifications can be made without departing from the scope of the present disclosure.

REFERENCE SIGNS LIST

11 Solid-state image sensor
12 Pixel region
13 Vertical drive circuit
14 Column signal processing circuit
15 Horizontal drive circuit
16 Output circuit
17 Control circuit
21 Pixel, normal pixel
21 Pixel, normal pixel
21X Specific pixel
23 Vertical signal line
24 PD
25 Transfer transistor
26 FD
27 Amplifier transistor 28 Selection transistor
29 Reset transistor
31-1 to 31-4 Predetermined range
41 Sensor substrate
42 Logic substrate
43-1 and 43-2 Connection terminal
44-1 and 44-2 Connection terminal
45-1 and 45-2 Bias transistor
51 Semiconductor layer
52 Wiring layer
53 Wiring layer
54 Semiconductor substrate
55 Insulating layer
56 Color filter layer
57 On-chip lens layer
61 Filter
62 On-chip lens
101 Imaging apparatus
102 Optical system
103 Imaging unit
104 Signal processing circuit
105 Display
106 Recording medium
107 Motion detection unit
108 Brightness detection unit
109 AF control unit
110 Drive unit

The invention claimed is:

1. A solid-state image sensor comprising:
a plurality of pixels outputting a pixel signal used to construct an image; and
a logic circuit for driving the plurality of pixels and including a vertical drive circuit and a horizontal drive circuit; and
a stacked structure in which a first semiconductor substrate including the plurality of the pixels and a second semiconductor substrate including the logic circuit are joined together, and
wherein a specific pixel among the plurality of the pixels is connected to the logic circuit independently of a normal pixel other than the specific pixel among the plurality of pixels, the specific pixel outputting a pixel signal used in specific processing other than imaging processing in which the image is constructed, and
wherein the vertical drive circuit supplies a first drive signal for each row of the plurality of pixels and the horizontal drive circuit supplies a second drive signal for each column of the plurality of pixels.

2. The solid-state image sensor according to claim 1,
wherein the specific processing is performed on the basis of the pixel signal output from a predetermined number of specific pixels disposed with a predetermined ratio relative to normal pixels, and
the imaging processing is performed on the basis of a pixel signal output from all of the plurality of the pixels when a predetermined operation instructing imaging of the image is performed.

3. The solid-state image sensor according to claim 2,
wherein the specific processing is motion detection processing that detects a motion of a subject captured in the image.

4. The solid-state image sensor according to claim 2,
wherein the specific processing is illuminance detection processing that detects ambient illuminance of an environment in which an electronic apparatus equipped with the solid-state image sensor is placed.

5. The solid-state image sensor according to claim 1,
wherein the specific pixel is a phase difference pixel used to acquire a phase difference image that is constructed of a pixel signal obtained by shielding radiated light at a region corresponding to a part of an opening, and
the specific processing is focus processing that brings a subject into focus on the basis of a difference in a position of the subject captured in each of a pair of the phase difference images constructed of the pixel signal output from the phase difference pixel.

6. The solid-state image sensor according to claim 5,
wherein a light-shielding region formed of a light-shielding film disposed in the specific pixel is different from a light-shielding region formed of a light-shielding film disposed in the normal pixel, and shields at least a part of the opening of the specific pixel.

7. The solid-state image sensor according to claim 5,
wherein a color of light transmitted through a filter disposed in the specific pixel is different from a color of light transmitted through a filter disposed in the normal pixel.

8. The solid-state image sensor according to claim 5,
wherein an optical characteristic of an on-chip lens disposed on the specific pixel is different from an optical characteristic of an on-chip lens disposed on the normal pixel.

9. The solid-state image sensor according to claim 5,
wherein an insulating film stacked on a semiconductor substrate configuring the first semiconductor substrate has a different thickness between the specific pixel and the normal pixel.

10. The solid-state image sensor according to claim 1,
wherein an accumulation time for which a photoelectric conversion unit included in the specific pixel performs a photoelectric conversion to accumulate electric charge is different from the accumulation time in the normal pixel.

11. The solid-state image sensor according to claim 1,
wherein a potential of a photoelectric conversion unit included in the specific pixel is different from a potential of a photoelectric conversion unit included in the normal pixel.

12. The solid-state image sensor according to claim 1,
wherein the pixel signal output from the specific pixel is corrected by using the pixel signal from a predetermined normal pixel in the vicinity of the specific pixel.

13. The solid-state image sensor according to claim 1,
wherein the pixel signal output from the normal pixel around the specific pixel is corrected by using a pixel signal from a predetermined normal pixel in the vicinity of the normal pixel around the specific pixel.

14. The solid-state image sensor according to claim 1,
wherein there is stacked a third semiconductor substrate including another pixel formed at a position deeper than the plurality of pixels in the first semiconductor substrate.

15. The solid-state image sensor of claim 1, wherein the logic circuit further comprises:
a first bias transistor electrically connected to the normal pixel and at least one other normal pixel; and
a second bias transistor electrically connected to the specific pixel, wherein a gate of the first bias transistor and a gate of the second bias transistor receive a bias voltage so that the first bias transistor and the second bias transistor output a constant current.

16. An electronic apparatus including a solid-state image sensor comprising:

a plurality of pixels outputting a pixel signal used to construct an image; and a logic circuit driving the plurality of pixels and including a vertical drive circuit and a horizontal drive circuit; and a stacked structure in which a first semiconductor substrate including the plurality of the pixels and a second semiconductor substrate including the logic circuit are joined together, and wherein a specific pixel among the plurality of the pixels is connected to the logic circuit independently of a normal pixel other than the specific pixel among the plurality of pixels, the specific pixel being outputting the pixel signal used in specific processing other than imaging processing in which the image is constructed, wherein the vertical drive circuit supplies a first drive signal for each row of the plurality of pixels and the horizontal drive circuit supplies a second drive signal for each column of the plurality of pixels.

17. An imaging method employed by a solid-state image sensor that includes a plurality of pixels outputting a pixel signal used to construct an image and a logic circuit driving the plurality of pixels, the solid-state image sensor including a stacked structure in which a first semiconductor substrate including the plurality of pixels and a second semiconductor substrate including the logic circuit are joined together, wherein a specific pixel among the plurality of pixels is connected to the logic circuit independently of a normal pixel other than the specific pixel among the plurality of pixels, the specific pixel outputting the pixel signal used in specific processing other than imaging processing in which the image is constructed, the method comprising the steps of:

performing the specific processing on the basis of the pixel signal output from a predetermined number of specific pixels disposed with a predetermined ratio relative to normal pixels; and performing the imaging processing on the basis of the pixel signal output from all of the plurality of pixels when a predetermined operation instructing imaging of the image is performed, wherein the specific pixel is a phase difference pixel used to acquire a phase difference image that is constructed of a pixel signal obtained by shielding radiated light at a region corresponding to a part of an opening, wherein the specific processing is focus processing that brings a subject into focus on the basis of a difference in a position of the subject captured in each of a pair of the phase difference images constructed of the pixel signal output from the phase difference pixel; and storing motion information acquired in the focus processing along with the image imaged in the imaging processing.

* * * * *